(12) United States Patent
Chou et al.

(10) Patent No.: US 10,395,974 B1
(45) Date of Patent: Aug. 27, 2019

(54) METHOD FOR FORMING A THIN SEMICONDUCTOR-ON-INSULATOR (SOI) SUBSTRATE

(71) Applicant: Taiwan Semiconductor Manufacturing Co., Ltd., Hsin-Chu (TW)

(72) Inventors: Shih-Pei Chou, Tainan (TW);
Hung-Wen Hsu, Tainan (TW);
Jiech-Fun Lu, Madou Township (TW);
Yu-Hung Cheng, Tainan (TW);
Yung-Lung Lin, Taichung (TW);
Min-Ying Tsai, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/962,214

(22) Filed: Apr. 25, 2018

(51) Int. Cl.
*H01L 21/762* (2006.01)
*H01L 21/306* (2006.01)

(52) U.S. Cl.
CPC .. *H01L 21/76256* (2013.01); *H01L 21/30604* (2013.01)

(58) Field of Classification Search
None
See application file for complete search history.

(56) References Cited

U.S. PATENT DOCUMENTS

| 5,013,681 | A | 5/1991 | Godbey et al. |
| 8,748,292 | B2 * | 6/2014 | Langdo ............ H01L 29/78687 438/459 |
| 9,711,521 | B2 | 7/2017 | Syu et al. |

OTHER PUBLICATIONS

Bhat, K.N. "Silicon on Insulator (SOI) Devices." E3-327 Nanoelectronics Devices lecture series Lecture # 23, 24 &25 23, 25 & Oct. 30, 2007.

(Continued)

*Primary Examiner* — Thien F Tran
(74) *Attorney, Agent, or Firm* — Eschweiler & Potashnik, LLC

(57) ABSTRACT

Various embodiments of the present application are directed to a method for forming a thin semiconductor-on-insulator (SOI) substrate at low cost and with low total thickness variation (TTV). In some embodiments, an etch stop layer is epitaxially formed on a sacrificial substrate. A device layer is epitaxially formed on the etch stop layer and has a different crystalline lattice than the etch stop layer. The sacrificial substrate is bonded to a handle substrate, such that the device layer and the etch stop layer are between the sacrificial and handle substrates. The sacrificial substrate is removed. An etch is performed into the etch stop layer to remove the etch stop layer. The etch is performed using an etchant comprising hydrofluoric acid, hydrogen peroxide, and acetic acid.

20 Claims, 11 Drawing Sheets

(56) References Cited

OTHER PUBLICATIONS

Hars, Adele. "RF-SOI vs. FD-SOI with RF—What's the Difference?" Published on Oct. 28, 2015. Retrieved online on Feb. 28, 2018 from https://soiconsortium.eu/2015/10/28/rf-soi-vs-fd-soi-with-rf-whats-the-difference/.
Fiorenza, et al. "Experimental Comparison of RF Power LDMOSFETs on Thin-Film SOI and Bulk Silicon." IEEE Transactions on Electron Devices, vol. 49, No. 4, Apr. 2002.
Current, et al. What is the Future of Sub-100nm CMOS: Ultrashallow Junctions or Ultrathin SOI? Solid State Technology, Sep. 2000.
Wikipedia.org. "Silicon on Insulator." The page was last edited on Oct. 16, 2017. Retrieved online on Feb. 14, 2018 from https://en.wikipedia.org/wiki/Silicon_on_insulator.

* cited by examiner

METHOD FOR FORMING A THIN SEMICONDUCTOR-ON-INSULATOR (SOI) SUBSTRATE

BACKGROUND

Integrated circuits have traditionally been formed on bulk semiconductor substrates. In recent years, semiconductor-on-insulator (SOI) substrates have emerged as an alternative to bulk semiconductor substrates. An SOI substrate comprises a handle substrate, an insulating layer overlying the handle substrate, and a device layer overlying the insulating layer. Among other things, an SOI substrate leads to reduced parasitic capacitance, reduced leakage current, reduced latch up, and improved semiconductor device performance (e.g., lower power consumption and higher switching speed).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
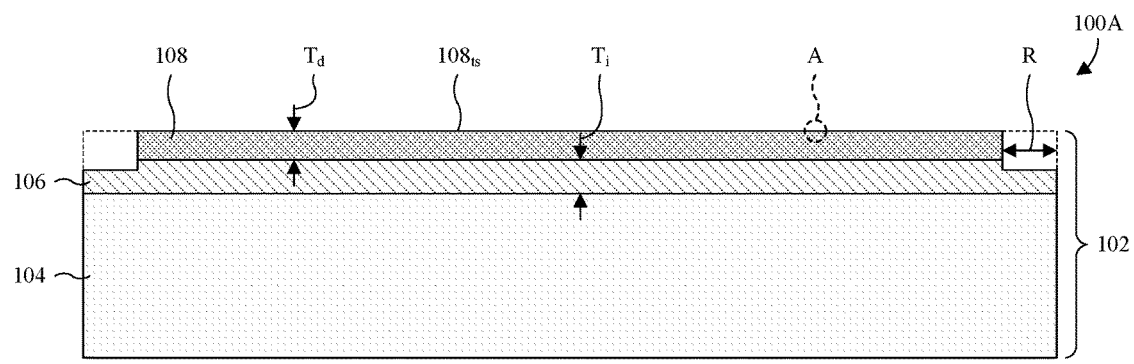
FIG. 1A illustrates a cross-sectional view of some embodiments of a semiconductor-on-insulator (SOI) substrate.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Thin SOI wafers with device layer thicknesses less than about 120 or 150 nanometers, and total thickness variations (TTVs) less than about 10 nanometers, find application with fully-depleted metal-oxide-semiconductor (MOS) devices and other advanced MOS devices, and further find application with partially-depleted MOS devices. Among other things, such thin SOI wafers promote low leakage, high power efficiency, and high speed in MOS devices formed upon the device layers of the thin SOI wafers.

According to a method for forming thin SOI wafers, a semiconductor wafer is oxidized to form an oxide layer surrounding the semiconductor wafer. Hydrogen ions are implanted into the semiconductor wafer, through the oxide layer, to form a hydrogen-rich region buried in the semiconductor wafer. The semiconductor wafer is bonded to a handle wafer through the oxide layer, and the semiconductor wafer is split along the hydrogen-rich region to partially remove the oxide layer and the semiconductor wafer from the handle wafer. A chemical mechanical polish (CMP) is performed into a portion of the semiconductor wafer remaining on the handle wafer to flatten the remaining portion. The handle wafer, the remaining portion of the semiconductor wafer (i.e., the device layer), and a portion of the oxide layer remaining on the handle wafer (i.e., the insulating layer) collectively define the SOI wafer.

A challenge with forming thin SOI wafers according to the method is that the method is costly due to the hydrogen implant, the splitting, and the CMP. Further, other less costly methods for forming SOI wafers may be unsuitable for forming thin SOI wafers with device layer thicknesses less than about 120 or 150 nanometers and TTVs less than about 10 nanometers. As such, these other methods may be unsuitable for forming thin SOI wafers for use with, among other things, fully-depleted MOS devices, other advanced MOS devices, or partially-depleted MOS devices.

Various embodiments of the present application are directed towards a method for forming a thin SOI substrate at low cost and with a low TTV. In some embodiments, an etch stop layer is epitaxially formed on a sacrificial substrate. A device layer is epitaxially formed on the etch stop layer and has a different crystalline lattice than the etch stop layer. An insulating layer is formed on a handle substrate. The sacrificial substrate is bonded to the handle substrate, such that the insulating layer, the device layer, and the etch stop layer are stacked between the sacrificial and handle substrates. The sacrificial substrate is removed. An etch is performed into the etch stop layer to remove the etch stop layer. The etch is performed using an etchant comprising hydrofluoric acid, hydrogen peroxide, and acetic acid.

In at least some embodiments, the etchant removes the etch stop layer with high selectivity, such that the device layer is minimally damaged by the removal and has a low TTV. The low TTV may, for example, be less than about 10 nanometers. Further, by forming the device layer by epitaxy, a thickness of the device layer may be controlled to a high degree and, in at least some embodiments, the device layer may have a thickness less than about 120 nanometers. Also, by forming the device layer by epitaxy, the device layer has high crystalline quality and a low concentration of dislocations and other crystalline defects. As a result, semiconductor devices formed on the device layer may have low leakage current, high power efficiency, and high speed. Further yet, because the method does not rely upon a hydrogen implant and splitting, the method may form the thin SOI substrate at low cost.

With reference to FIG. 1, a cross-sectional view 100A of some embodiments of a SOI substrate 102 is provided. In some embodiments, the SOI substrate 102 has a circular top layout and/or has a diameter of about 200, 300, or 450 millimeters. In other embodiments, the SOI substrate 102 has some other shape and/or some other dimensions. Further, in some embodiments, the SOI substrate 102 is a semiconductor wafer. The SOI substrate 102 comprises a handle substrate 104, an insulating layer 106, and a device layer 108.

The handle substrate 104 may be or comprise, for example, monocrystalline silicon, some other silicon material, some other semiconductor material, or any combination of the foregoing. In some embodiments, the handle substrate 104 is lightly doped with n-type or p-type dopants so as to have a high resistance. The high resistance improves the Q factor of passive devices (not shown) formed on the SOI substrate 102, which may be beneficial for the RF applications of the SOI substrate 102. The high resistance may, for example, be greater than about 1, 3, 4, or 10 kilo-ohms/centimeter (kΩ/cm), and/or may, for example, be between about 1-4 kΩ, about 4-10 kΩ, or about 1-10 kΩ.

The insulating layer 106 overlies the handle substrate 104 and may be or comprise, for example, silicon oxide, silicon-rich oxide (SRO), some other oxide, silicon carbide, silicon nitride, some other dielectric, or any combination of the foregoing. In some embodiments, a thickness $T_i$ of the insulating layer 106 is between about 50-1500 nanometers, about 50-750 nanometers, about 750-1500 nanometers, or about 550 nanometers.

The device layer 108 overlies the insulating layer 106 and may, for example, be or comprise monocrystalline silicon, some other silicon, some other semiconductor material, or any combination of the foregoing. As seen hereafter, the device layer 108 has a low density of crystalline defects (e.g., due to the use of epitaxy to form the device layer 108). The low density of crystalline defects may, for example, be a density of crystalline defects less than about $10^{16}$, $10^{15}$, or $10^{10}$ inverse cubic centimeters ($cm^{-3}$). Further, the low density of crystalline defects may, for example, lead to low leakage current and high performance (e.g., power efficiency, switching speed, etc.) for semiconductor devices formed on the device layer 108.

A thickness $T_d$ of the device layer 108 is small (i.e., the device layer 108 is thin). In some embodiments, the thickness $T_d$ of the device layer 108 is small in that it is less than about 10, 50, 110, 120, or 150 nanometers, and/or between about 110-150 nanometers, about 10-60 nanometers, about 60-100 nanometers, or about 100-150 nanometers. Further, in some embodiments, the thickness $T_d$ is small in that it is equal to a depletion region width of a semiconductor device (not shown) on the SOI substrate 102. The semiconductor device may be, for example, a MOS field-effect transistor (MOSFET) or some other semiconductor device, and/or the depletion region width may, for example, be the depth to which a depletion region of the semiconductor device extends in the device layer 108.

The small thickness $T_d$ of the device layer 108 may, for example, promote enhanced electrical isolation between semiconductor devices (not shown) formed on the device layer 108. For example, due to the small thickness $T_d$, isolation structures (not shown) may extend fully through the device layer 108 to provide complete or near complete electrical isolation between neighboring semiconductor devices. Further, the small thickness $T_d$ of the device layer 108 may, for example, enable the formation of fully-depleted semiconductor devices, which generally have higher switching speeds and higher power efficiency than their partially-depleted counterparts.

A top surface $108_{ts}$ of the device layer 108 is generally smooth, such that a TTV of the device layer 108 is low. In some embodiments, the TTV of the device layer 108 is low in that it is less than about 20, 10, or 5 nanometers, and/or between about 5-20 nanometers, about 5-12 nanometers, about 12-20 nanometers, or about 8-12 nanometers. The low TTV promotes uniformity in parameters of semiconductor devices (not shown) formed on the device layer 108. Such parameters may, for example, include threshold voltage, on-current, and so on. As semiconductor devices continue to shrink, the low TTV becomes increasingly important.

In some embodiments, sidewalls of the device layer 108 are laterally recessed by a recess amount R from sidewalls of the handle substrate 104. The recess amount R may, for example, be about 2-4 millimeters, about 2-3 millimeters, about 3-4 millimeters, or less than about 2 millimeters. As seen hereafter, laterally recessing the sidewalls of the device layer 108 may remove edge defects that form during formation of the SOI substrate 102.

Figure 1B:
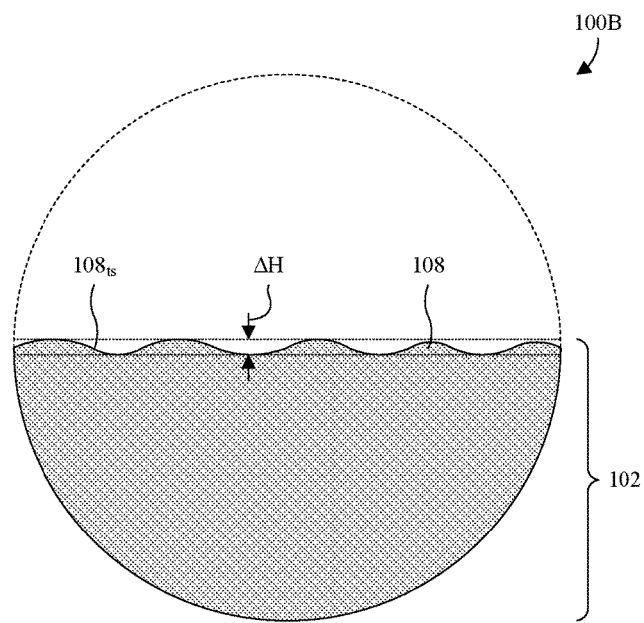
FIG. 1B illustrates an enlarged cross-sectional view of some embodiments of a device layer of the SOI substrate of FIG. 1A.

With reference to FIG. 1B, an enlarged cross-sectional view 100B of some embodiments of the device layer 108 of FIG. 1A is provided. The enlarged cross-sectional view 100B may, for example, be taken within circle A of FIG. 1A. While the top surface $108_{ts}$ of the device layer 108 is generally smooth, as seen in FIG. 1A, the top surface $108_{ts}$ has a minimal amount of unevenness when viewed in close proximity. In some embodiments, a height difference ΔH between a highest point along the top surface $108_{ts}$ of the device layer 108 and a lowest point along the top surface $108_{ts}$ of the device layer 108 is equal to the TTV of the device layer 108. Further, in some embodiments, the height different ΔH is less than about 20, 10, or 5 nanometers, and/or is between about 5-20 nanometers, about 5-12 nanometers, about 12-20 nanometers, or about 8-12 nanometers.

Figure 2:
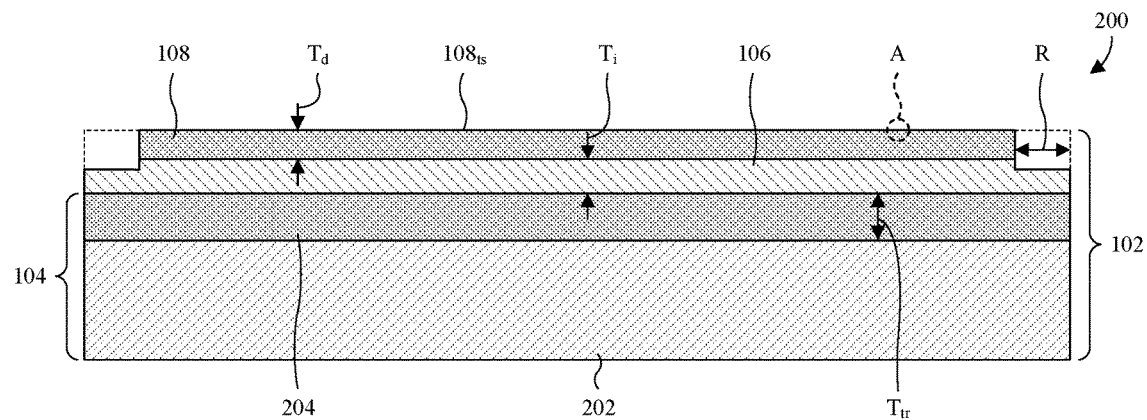
FIG. 2 illustrates a cross-sectional view of some more detailed embodiments of the SOI substrate of FIG. 1A in which a handle substrate of the SOI substrate includes a trap-rich layer.

With reference to FIG. 2, a cross-sectional view 200 of some more detailed embodiments of the SOI substrate 102 of FIG. 1 is provided in which the handle substrate 104 comprises a high-resistance substrate 202 and a trap-rich layer 204.

The high-resistance substrate 202 has a high resistance and may be or comprise, for example, monocrystalline silicon, some other silicon material, some other semiconductor material, or any combination of the foregoing. The high resistance may, for example, be a resistance greater than about 1, 3, 4, or 10 kΩ/cm, and/or may, for example, be between about 1-4 kΩ, about 4-10 kΩ, or about 1-10 kΩ. The high resistance improves the Q factor of passive devices (not shown) formed on the SOI substrate 102, which may be beneficial for the RF applications of the SOI substrate 102. In some embodiments, the high resistance of the high-resistance substrate 202 is achieved by lightly doping the high-resistance substrate 202.

The trap-rich layer 204 overlies the high-resistance substrate 202 and has a high density of carrier traps (e.g., electron or hole traps) relative to the high-resistance substrate 202 and/or relative to the device layer 108. The carrier traps may, for example, be dislocations and/or other defects in a crystalline lattice of the trap-rich layer 204, and the high density of carrier traps may, for example, be greater than about $10^{16}$, $10^{18}$, or $10^{20}$ cm$^{-3}$. The carrier traps of the trap-rich layer 204 absorb RF signals from semiconductor devices (not shown) on the device layer 108 by the photoelectric effect. The absorption depresses eddy currents that may form at a boundary between high-resistance substrate 202 and the trap-rich layer 204, whereby the absorption may reduce reflected RF signals and enhance RF performance.

In some embodiments, the trap-rich layer 204 is or comprises undoped polycrystalline silicon, amorphous silicon, or some other suitable semiconductor material that has a high density of carrier traps. In some embodiments in which the trap-rich layer 204 is or comprises undoped polycrystalline silicon, the carrier traps concentrate at grain boundaries of the undoped polycrystalline silicon and reducing grain sizes of the undoped polycrystalline silicon increases the density of carrier traps in the undoped polycrystalline silicon. In some embodiments, a thickness $T_{tr}$ of the trap-rich layer 204 is between about 2-4 micrometers, about 2-3 micrometers, or about 3-4 micrometers. For example, the thickness $T_{tr}$ may be about 2.55 micrometers.

Figure 3:
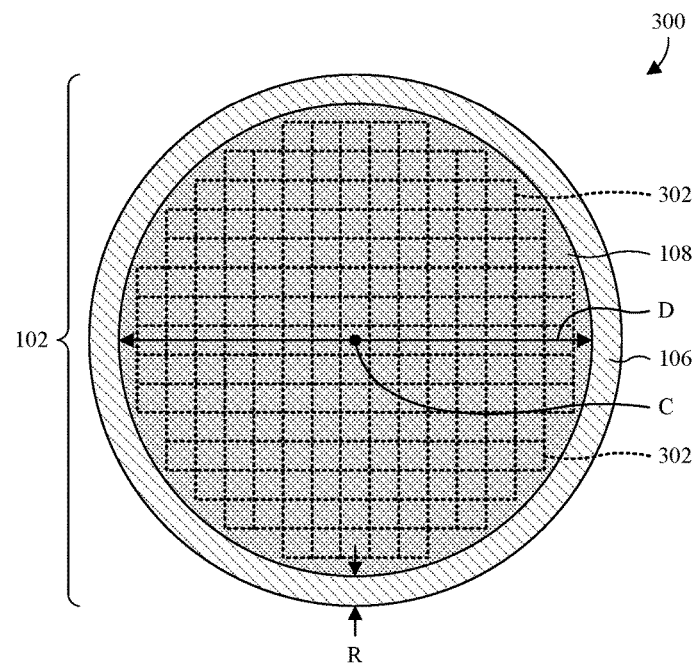
FIG. 3 illustrates a top view of some embodiments of the SOI substrate of FIG. 1A.

With reference to FIG. 3, a top view 300 of some embodiments of the SOI substrate 102 of FIG. 1A or 2 is provided. The SOI substrate 102 is circular and comprises a plurality of IC dies 302 arranged in a grid across the device layer 108. For ease of illustration, only some of the IC dies 302 are labeled 302. Further, a sidewall of the device layer 108 is laterally recessed towards a center C of the SOI substrate 102, relative to a sidewall of the insulating layer 106, by the recess amount R. As described above, the recess amount R may, for example, be about 2-4 millimeters, about 2-3 millimeters, about 3-4 millimeters, or less than about 2 millimeters.

Figure 4:
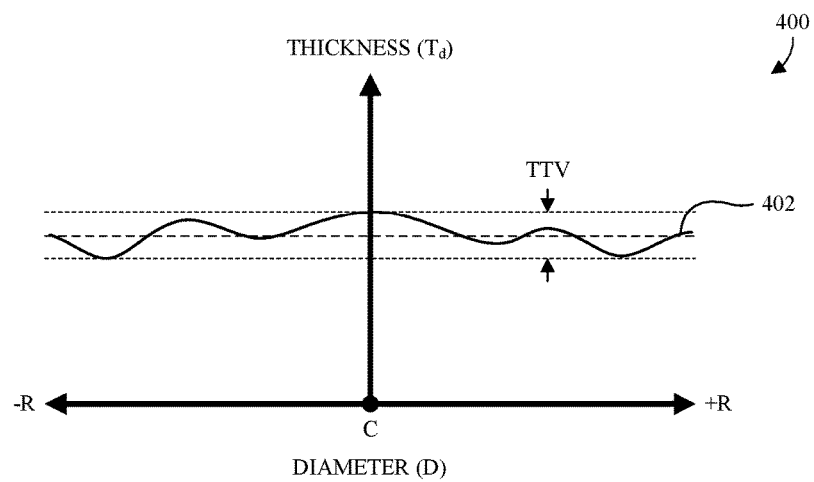
FIG. 4 illustrates a graph of some embodiments of a thickness curve for some embodiments of a device layer of the SOI substrate of FIG. 1A.

With reference to FIG. 4, a graph 400 illustrates a thickness curve 402 for some embodiments of the device layer 108 of FIG. 3. The thickness curve 402 describes thickness $T_d$ of the device layer 108 as a function of location along a diameter D (also shown in FIG. 3) of device layer 108. The diameter D has a length of two times the radius R of the device layer 108 and extends from −R to +R, where the radius R is positive and negative relative to the center C of the device layer 108. Further, the thickness curve 402 has a TTV that is low. The TTV is the difference between the lowest thickness along the thickness curve 402 and the highest thickness along the thickness curve 402. The TTV may, for example, be low in that it is less than about 20, 10, or 5 nanometers, and/or between about 5-20 nanometers, about 5-12 nanometers, about 12-20 nanometers, or about 8-12 nanometers.

Figure 5:
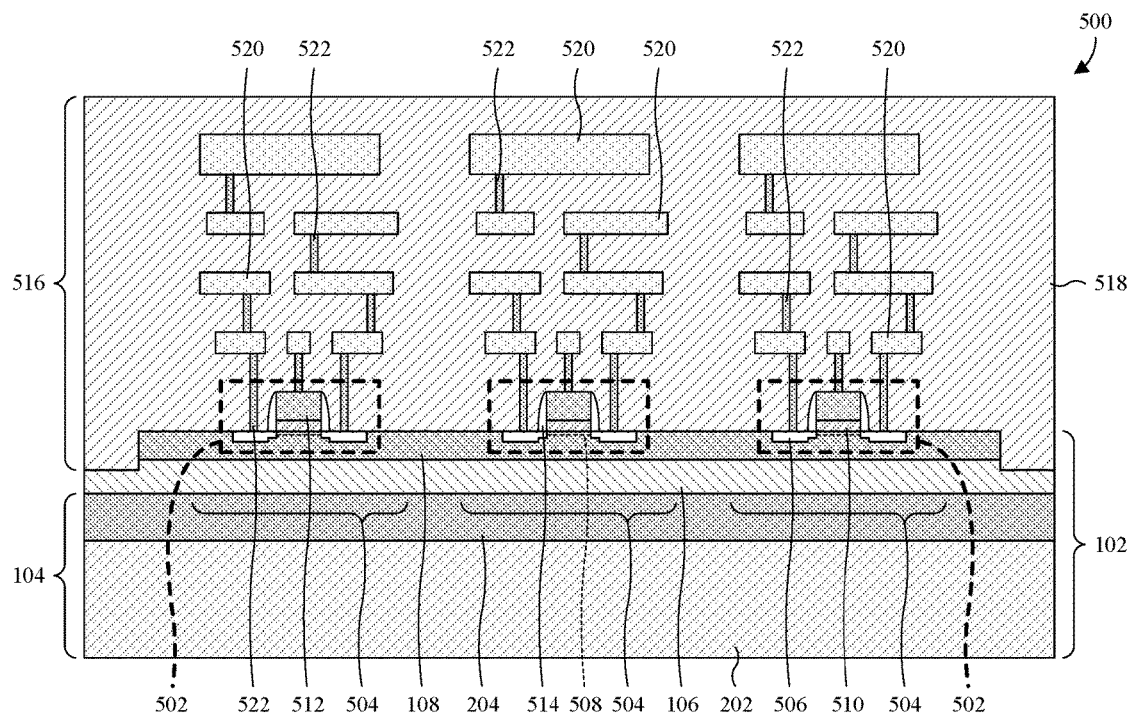
FIG. 5 illustrates a cross-sectional view of some embodiments of a semiconductor structure in which the SOI substrate of FIG. 2 finds application.

With reference to FIG. 5, a cross-sectional view 500 of some embodiments of a semiconductor structure in which the SOI substrate 102 of FIG. 2 finds application is provided. The semiconductor structure comprises a plurality of semiconductor devices 502 laterally spaced over the device layer 108. For ease of illustration, only some of the semiconductor devices 502 are labeled 502. The semiconductor devices 502 may be, for example, MOSFETs, some other MOS devices, some other insulated-gate field-effect transistors (IGFETs), some other semiconductor devices, or any combination of the foregoing.

In some embodiments, the semiconductor devices 502 each correspond to an individual IC die 504, such that the semiconductor devices 502 are the same. In some embodiments, each of the semiconductor devices 502 comprises a pair of source/drain regions 506, a selectively-conductive channel 508, a gate dielectric layer 510, and a gate electrode 512. For ease of illustration, only one of the source/drain regions 506 is labeled 506, only one of the selectively-conductive channels 508 is labeled 508, only one of the gate dielectric layers 510 is labeled 510, and only one of the gate electrodes 512 is labeled 512.

The source/drain regions 506 and the selectively-conductive channel 508 are in the device layer 108. The source/drain regions 506 are laterally spaced, and the selectively-conductive channel 508 extends from one of the source/drain regions 506 to another one of the source/drain regions 506. The source/drain regions 506 have a first doping type and directly adjoin a portion of the device layer 108 having a second doping type opposite the first doping type. The gate dielectric layer 510 and the gate electrode 512 are stacked over the selectively-conductive channel 508, such that the gate electrode 512 overlies the gate dielectric layer 510. The gate dielectric layer 510 may be or comprise, for example, silicon oxide and/or some other dielectric material, and/or the gate electrode 512 may be or comprise, for example, doped polysilicon, metal, some other conductive material, or any combination of the foregoing.

In some embodiments, each of the semiconductor devices 502 further comprises spacers 514 lining sidewalls of the gate electrode 512 and overlying the source/drain regions 506. For ease of illustration, only one of the spacers 514 is labeled 514. The spacers 514 may be or comprise, for example, silicon oxide, silicon nitride, silicon oxynitride, silicon carbide, some other dielectric, or any combination of the foregoing.

A back-end-of-line (BEOL) interconnect structure 516 covers the SOI substrate 102 and the semiconductor devices 502. The BEOL interconnect structure 516 comprises an interconnect dielectric layer 518, a plurality of wires 520, and a plurality of vias 522. For ease of illustration, only some of the wires 520 are labeled 520, and only some of the vias 522 are labeled 522. The interconnect dielectric layer 518 may be or comprise, for example, silicon oxide, a low κ dielectric, some other suitable dielectric, or any combination of the foregoing. As used herein, a low κ dielectric may be or comprise, for example, a dielectric with a dielectric constant κ less than about 3.9, 3, 2, or 1.

The wires 520 and the vias 522 are alternatingly stacked over the semiconductor devices 502 and define conductive paths electrically coupled to the semiconductor devices 502. In some embodiments, topmost wires of the wires 520 are thicker than underlying wires of the wires 520. The electrical paths may, for example, electrical couple the semiconductor devices 502 to other semiconductor devices (not shown), contact pads, or some other device or structure. The wires 520 and the vias 522 may be or comprise, for example, copper, aluminum copper, aluminum, tungsten, some other metal, or any combination of the foregoing.

Figure 6:
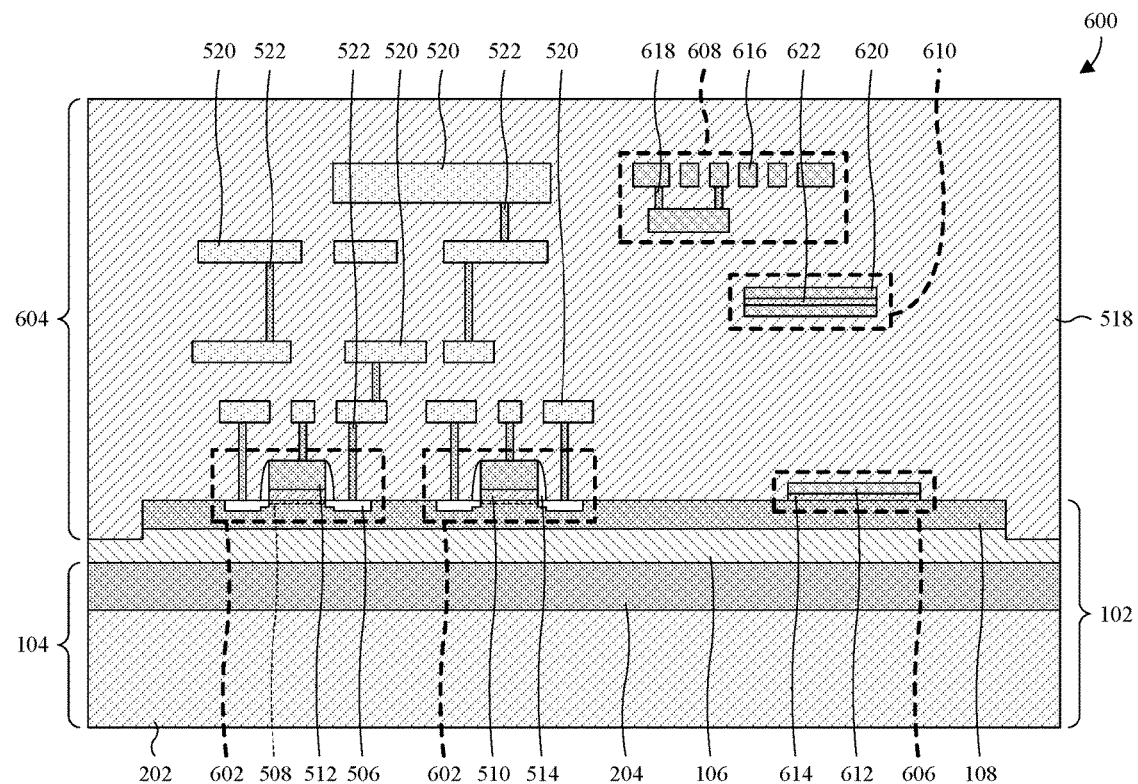
FIG. 6 illustrates a cross-sectional view of some other embodiments of a semiconductor structure in which the SOI substrate of FIG. 2 finds application.

With reference to FIG. 6, a cross-sectional view 600 of some other embodiments of a semiconductor structure in which the SOI substrate 102 of FIG. 2 finds application. The semiconductor structure comprises a plurality of semiconductor devices 602, a BEOL interconnect structure 604, and a plurality of passive devices.

The semiconductor devices 602 are laterally spaced over the device layer 108, and the BEOL interconnect structure covers the SOI substrate 102 and the semiconductor devices 602. The semiconductor devices 602 are as the semiconductor devices 502 of FIG. 5 are described, such that the same reference numerous are used to identify the individual elements of the semiconductor devices 602. The semiconductor devise 602 may be, for example, MOSFETs, some other MOS devices, some other IGFETs, some other semiconductor devices, or any combination of the foregoing. The BEOL interconnect structure 604 is as the BEOL interconnect structure 516 of FIG. 5 is described, such that the same reference numerous are used to identify the individual elements of the semiconductor devices 602.

The passive devices overlie the SOI substrate 102 and comprise a resistor 606, an inductor 608, a capacitor 610, or any combination of the foregoing. The passive devices may, for example, be employed for RF applications of the SOI substrate 102, and the trap-rich layer 204 may, for example, improve a quality factor of the inductor 608.

In some embodiments, the resistor 606 comprises a resistive layer 612 and an insulating layer 614 stacked on the device layer 108. The resistive layer 612 may, for example, be or comprise doped polysilicon or some other conductive material with the desired resistance. In embodiments in which the resistive layer 612 is or comprises doped polysilicon, doping concentration of the doped polysilicon may be varied to control the resistance of the resistive layer 612. The insulating layer 614 may, for example, be silicon oxide, some other dielectric material, or any combination of the foregoing.

In some embodiments, the inductor 608 is in the BEOL interconnect structure 604 and comprises one or more inductor wires 616. For ease of illustration, only one of the multiple inductor wires 616 illustrated is labeled 616. In some embodiments in which the inductor 608 comprises multiple inductor wires, the inductor wires span multiple heights above the SOI substrate 102 and one or more inductor vias 618 interconnect the inductor wires across the multiple heights. For ease of illustration, only one of the multiple inductor vias 618 illustrated is labeled 618. The one or more inductor wires 616 and the one or more inductor vias 618 may be or comprise, for example, copper, aluminum copper, aluminum, tungsten, some other metal, or any combination of the foregoing.

In some embodiments, the capacitor 610 is in the BEOL interconnect structure 604 and comprises a pair of capacitor plates 620 and a capacitor insulating layer 622. For ease of illustration, only one of the capacitor plates 620 is labeled 620. The capacitor plates 620 and the capacitor insulating layer 622 are stacked with the capacitor insulating layer 622 between the capacitor plates 620. The capacitor plates 620 may be or comprise, for example, copper, aluminum copper, aluminum, tungsten, some other metal, or any combination of the foregoing. The capacitor insulator layer 622 may be or comprise, for example, silicon dioxide, some other dielectric material, or any combination of the foregoing.

While FIGS. 5 and 6 are illustrated using the SOI substrate 102 of FIG. 2, it is to be understood that the SOI substrate 102 of FIG. 1A may be used in place of the of the SOI substrate 102 of FIG. 2 in other embodiments.

With reference to FIGS. 7-21, a series of cross-sectional views 700-2100 of some embodiments of a method for forming and using an SOI substrate 102 is provided. The method is illustrated with regard to the SOI substrate 102 of FIG. 2 but may also be used to form the SOI substrate 102 of FIG. 1A or some other SOI substrate.

Figure 7:
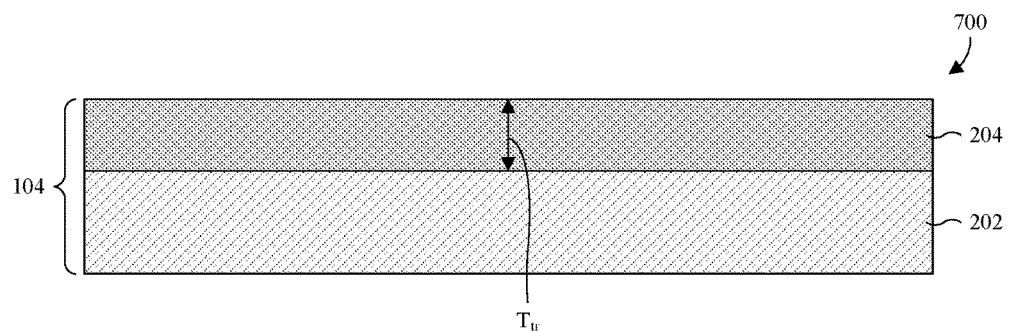
FIGS. 7-21 illustrate a series of cross-sectional views of some embodiments of a method for forming and using an SOI substrate.

As illustrated by the cross-sectional view 700 of FIG. 7, a handle substrate 104 is provided or formed. In some embodiments, the handle substrate 104 has a circular top layout and/or is a semiconductor wafer. The handle substrate 104 comprises a high-resistance substrate 202 and a trap-rich layer 204.

The high-resistance substrate 202 is a bulk semiconductor substrate and/or has a high resistance. The high resistance may, for example, be greater than about 1, 4, or 10 kΩ/cm, and/or may, for example, be between about 1-4 kΩ, about 4-10 kΩ, or about 1-10 kΩ. In some embodiments, the high-resistance substrate 202 is or comprises monocrystalline silicon, some other semiconductor material, or any combination of the foregoing, and/or the high resistance is achieved by lightly doping the high-resistance substrate 202.

The trap-rich layer 204 overlies the high-resistance substrate 202 and has a high density of carrier traps (e.g., electron or hole traps) relative to the high-resistance substrate 202. The carrier traps may, for example, be dislocations and/or other defects in a crystalline lattice of the trap-rich layer 204, and the high density of carrier traps may, for example, be greater than about $10^{16}$, $10^{18}$, or $10^{20}$ cm$^{-3}$. In some embodiments, the trap-rich layer 204 is or comprises undoped polycrystalline silicon, amorphous silicon, or some other semiconductor material that has a high density of carrier traps. In some embodiments, a thickness $T_{tr}$ of the trap-rich layer 204 is between about 2-4 micrometers, about 2-3 micrometers, or about 3-4 micrometers. For example, the thickness $T_{tr}$ may be about 2.55 micrometers.

In some embodiments, a process for forming the handle substrate 104 comprises providing the high-resistance substrate 202, and subsequently forming the trap-rich layer 204 over the high-resistance substrate 202. The trap-rich layer 204 may be formed by, for example, chemical vapor deposition (CVD), physical vapor deposition (PVD), atomic layer deposition (ALD), some other suitable deposition process, or any combination of the foregoing. Alternatively, the trap-rich layer 204 may be formed by, for example, damaging a top portion of the high-resistance substrate 202 to form the carrier traps. Such damage may, for example, be induced by ion implantation or some other suitable semiconductor process.

Figure 8:
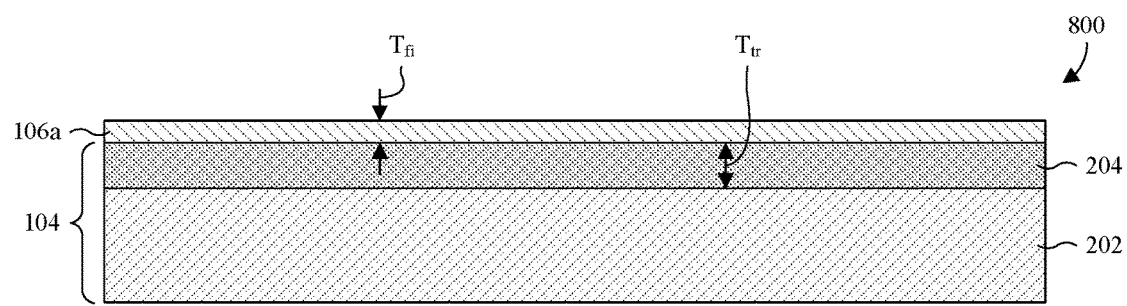

As illustrated by the cross-sectional view 800 of FIG. 8, a first thinning process is performed into a top surface of the trap-rich layer 204 to reduce the thickness $T_{tr}$ of the trap-rich layer 204. In some embodiments, the thickness $T_{tr}$ of the trap-rich layer 204 is reduced to between about 1.5-2.5 micrometers, about 1.5-2.0 micrometers, or about 2.0-2.5 micrometers. The first thinning process may, for example, be performed by a chemical mechanical polish (CMP) or some other suitable thinning process.

Also illustrated by the cross-sectional view 800 of FIG. 8, a first insulating layer 106a is formed covering the trap-rich layer 204. In some embodiments, the first insulating layer 106a is or comprises silicon oxide, some other suitable dielectric, or any combination of the foregoing. In some embodiments, a process for forming the first insulating layer 106a comprises depositing or growing the first insulating layer 106a by thermal oxidation, CVD, PVD, ALD, some other suitable oxidation and/or deposition process, or any combination of the foregoing. Further, in some embodiments, the process comprises performing a planarization into a top surface of the first insulating layer 106a to reduce a thickness $T_{fi}$ of the first insulating layer. The planarization may, for example, be performed by a CMP or some other suitable planarization process. In alternative embodiments of the process, the planarization is omitted. In some embodiments, the thickness $T_{fi}$ of the first insulating layer 106a upon completion of the process for forming the first insulating layer 106a is about 3.5-4.5 kilo-angstroms (kA), about 3.5-4.0 kA, about 4.0-4.5 kA, or about 4.0 kA. Further, in some embodiments, the thickness $T_{fi}$ of the first insulating layer 106a upon completion of the depositing or growing, and before the planarization, is about 4-6 kilo-angstroms (kA), about 4.5-5.5 kA, about 4.5-5.0 kA, or about 5.0-5.5 kA.

Figure 9:
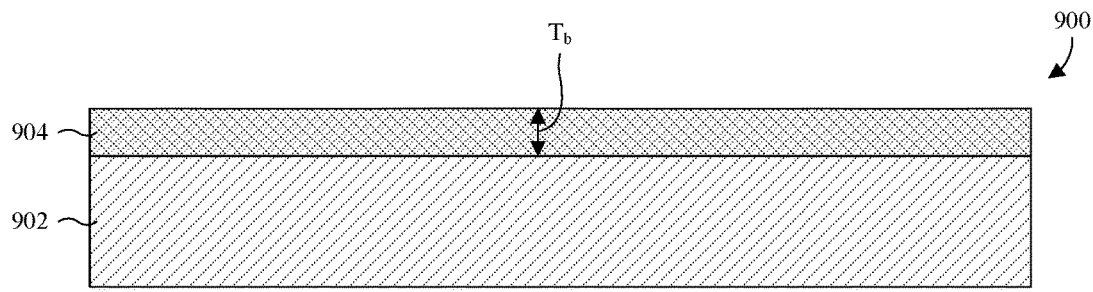

As illustrated by the cross-sectional view 900 of FIG. 9, a sacrificial substrate 902 is provided. In some embodiments, the sacrificial substrate 902 is a bulk semiconductor substrate and/or comprises, for example, monocrystalline silicon, some other suitable semiconductor material, or any combination of the foregoing. In some embodiments, the sacrificial substrate 902 is highly doped with n-type or p-type dopants. For example, the sacrificial substrate 902 may be doped in excess of about $10^{16}$, $10^{17}$, or $10^{18}$ cm$^{-3}$. In some embodiments, the sacrificial substrate 902 has a circular top layout and/or is a semiconductor wafer.

Also illustrated by the cross-sectional view 900 of FIG. 9, a buffer layer 904 is formed over the sacrificial substrate 902. In some embodiments, the buffer layer 904 is or comprises monocrystalline silicon, the same material as the sacrificial substrate 902, some other semiconductor material, or any combination of the foregoing. In some embodiments, the buffer layer 904 is doped with n-type or p-type dopants and/or has a doping concentration less than about $10^{17}$, $10^{16}$, or $10^{15}$ cm$^{-3}$. In some of such embodiments, the buffer layer 904 has the same doping type as the sacrificial substrate 902 and/or has a lower doping concentration than the sacrificial substrate 902. For example, the buffer layer 904 may be or comprise P− monocrystalline silicon, and the sacrificial substrate 902 may be or comprise P+ monocrystalline silicon. In some embodiments, a thickness $T_b$ of the buffer layer 904 is between about 1.8-4 micrometers, about 1-3 micrometers, or about 3-4 micrometers.

In some embodiments, a process for forming the buffer layer 904 comprises growing the buffer layer 904 on the sacrificial substrate 902 by molecular beam epitaxy (MBE), vapor phase epitaxy (VPE), liquid phase epitaxy (LPE), some other suitable epitaxial process, or any combination of the foregoing. In such embodiments, the sacrificial substrate 902 serves as a seed layer for the epitaxy. The epitaxy may, for example, fill holes and/or pits in a top of the sacrificial substrate 902, such that the buffer layer 904 provides a smooth top surface upon which to form subsequently described layers (e.g., an etch stop layer). Alternatively, in some embodiments, the buffer layer 904 is formed by counter doping a top portion of the sacrificial substrate 902, such that the top portion defines the buffer layer 904 and has a lower doping concentration than a remainder of the sacrificial substrate 902.

Figure 10:
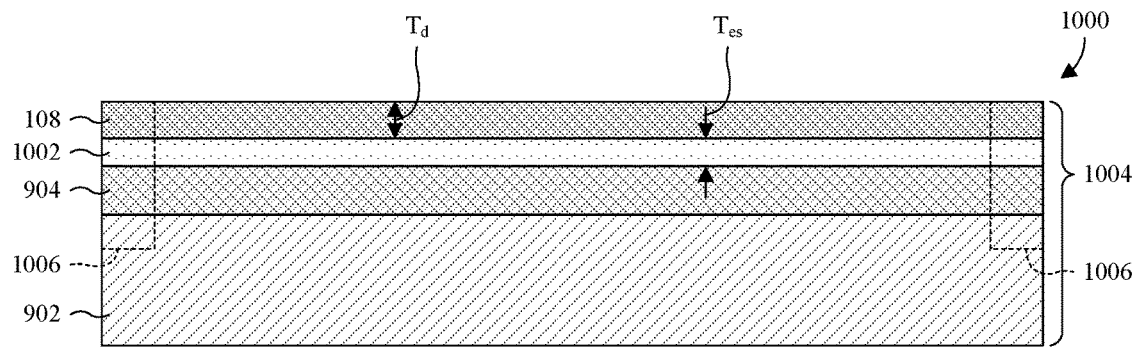

As illustrated by the cross-sectional view 1000 of FIG. 10, an etch stop layer 1002 and a device layer 108 are formed stacked over the buffer layer 904, such that the device layer 108 overlies the etch stop layer 1002. Collectively, the sacrificial substrate 902, the buffer layer 904, the etch stop layer 1002, and the device layer 108 define a device substrate 1004. The etch stop layer 1002 and the device layer 108 are crystalline materials with different crystalline lattices, such that etch stop layer 1002 induces stress (e.g., tensile or compressive stress) on the device layer 108. For example, the device layer 108 may be or comprise monocrystalline silicon, and the etch stop layer 1002 may be or comprise silicon germanium, whereby the etch stop layer 1002 may induce tensile stress on the device layer 108.

In some embodiments, the etch stop layer 1002 is or comprises silicon germanium, silicon carbide, some other crystalline material, or any combination of the foregoing. In some embodiments where the etch stop layer 1002 is or comprises silicon germanium, a concentration of germanium in the etch stop layer 1002 is between about 20-60, 20-40, or 40-60 atomic percent relative to silicon in the etch stop layer 1002. For example, the etch stop layer 1002 may be or comprise, for example, $Si_xGe_{1-x}$, where x ranges from about 0.4-0.8, 0.4-0.6, or 0.6-0.8. In some embodiments, a thickness $T_{es}$ of the etch stop layer 1002 is between about 10-200 nanometers, about 30-140 nanometers, about 10-100 nanometers, or about 100-200 nanometers. In some embodiments, a lattice constant of the etch stop layer 1002 is graded to reduce lattice mismatch between the etch stop layer 1002 and the buffer layer 904. For example, the lattice constant may be graded so the lattice constant changes (e.g., increase or decrease) in a single direction from a bottom surface of the etch stop layer 1002 to a top surface of the etch stop layer 1002, and so the lattice constant is about even with that of the buffer layer 904 at the bottom surface. The grading of the lattice constant may, for example, be realized by varying the relative proportions of elements in the etch stop layer 1002. For example, supposing the etch stop layer 1002 comprises a first material (e.g., silicon) and a second material (e.g., germanium), the concentration of the second material may change (e.g., increase or decrease) in a single direction from the bottom surface of the etch stop layer 1002 to the top surface of the etch stop layer 1002.

In some embodiments, the device layer 108 is or comprises, for example, monocrystalline silicon, some other semiconductor material, or any combination of the foregoing. In some embodiments, a thickness $T_d$ of the device layer 108 is less than about 10, 50, 110, 120, or 150 nanometers, and/or between about 110-150 nanometers, about 10-60 nanometers, about 60-100 nanometers, or about 100-150 nanometers. In some embodiments the thickness $T_d$ of the device layer 108 is less than a critical thickness. The critical thickness is the thickness above which the crystalline lattice of the device layer 108 partially or fully relaxes. Where the crystalline lattice of the device layer 108 partially or fully relaxes, dislocations or other crystalline defects form, which increase leakage current and reduce performance of the semiconductor devices hereafter formed on the device layer 108.

In some embodiments, the critical thickness decreases as the absolute difference between the lattice constant of the device layer 108 and the lattice constant of the etch stop layer 1002 increases. For example, where the device layer 108 is or comprises monocrystalline silicon and the etch stop layer 1002 is or comprises silicon germanium, increasing the concentration of germanium in the etch stop layer 1002 increases the lattice constant of the etch stop layer 1002. This, in turn, increases the absolute difference between the lattice constants of the device and etch stop layers 108, 1002, which decreases the critical thickness.

The etch stop layer 1002 and the device layer 108 are formed by epitaxy. For example, the etch stop layer 1002 and the device layer 108 may each be formed by MBE, VPE, LPE, some other suitable epitaxial process, or any combination of the foregoing. In some embodiments, the buffer layer 904 serves as a seed layer for the etch stop layer 1002, and/or the etch stop layer 1002 serves as a seed layer for the device layer 108. By forming the device layer 108 using the etch stop layer 1002 as a seed layer, and by forming the etch stop layer 1002 using the buffer layer 904 as a seed layer, crystalline quality of the etch stop layer 1002 and the device layer 108 are high and crystalline defects are low. As a result, semiconductor devices formed on the device layer 108 have, among other things, high performance and low leakage current.

In some embodiments where the etch stop layer 1002 serves as a seed layer for the device layer 108, the lattice constant of the etch stop layer 1002 is graded as described above to reduce lattice mismatch between the etch stop layer 1002 and the buffer layer 904. Lattice mismatch between the etch stop layer 1002 and the buffer layer 904 leads to dislocations and/or other crystalline defects in the etch stop layer 1002, such that the etch stop layer 1002 may have poor crystalline quality. The poor crystalline quality of the etch stop layer 1002 may then transfer to the device layer 108 when the etch stop layer 1002 serves as a seed layer. Therefore, grading the lattice constant of the etch stop layer 1002 may improve the crystalline quality of the device layer 108 and reduce crystalline defects in the device layer 108.

In some embodiments, the device layer 108 is formed at a low temperature to increase the critical thickness. As noted above, the critical thickness is the thickness above which the crystalline lattice of the device layer 108 partially or fully relaxes. The low temperature may, for example, be a temperature between about 450-650 degrees Celsius, between about 500-600 degrees Celsius, or less than about 450, 550, or 650 degrees Celsius.

Figure 11:
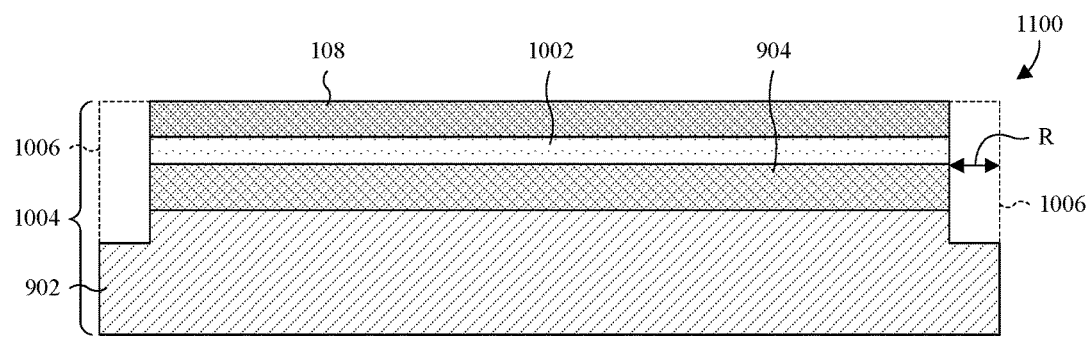

As illustrated by the cross-sectional view 1100 of FIG. 11, an edge portion 1006 (see FIG. 10) of the device substrate 1004 of FIG. 10 is removed. The edge removal may, for example, serve to prevent edge defects from forming in subsequent grinding and/or chemical wet etching. The edge portion 1006 has a pair of segments overlying the sacrificial substrate 902, and the segments are respectively on opposite sides of the sacrificial substrate 902. In some embodiments, the edge portion 1006 has a top layout that extends along an edge of the structure of FIG. 10 in a ring-shaped path or some other suitable closed path. The removing laterally recesses sidewalls of the buffer layer 904, sidewalls of the etch stop layer 1002, and sidewalls of the device layer 108 by a recess amount R relative to sidewalls of the sacrificial substrate 902. The recess amount R may, for example, be about 2-4 millimeters, about 2-3 millimeters, about 3-4 millimeters, or less than about 2, 3, or 4 millimeters.

In some embodiments, a process for removing the edge portion 1006 comprises forming a hard mask layer (not shown) covering the device substrate 1004. The hard mask layer may, for example, be or comprise, for example, silicon oxide, silicon nitride, silicon oxynitride, some other suitable dielectric, or any combination of the foregoing. Further, the hard mask layer may, for example, be formed by CVD, PVD, ALD, or some other deposition process. The hard mask layer is patterned with a layout of the edge portion 1006 using a photolithography process or some other suitable patterning process, and an etch is performed into the buffer layer 904, the etch stop layer 1002, and the device layer 108 with the patterned hard mask layer in place to remove the edge portion 1006. In some embodiments, a wafer edge exposure tool is used to pattern photoresist of the photolithography process. In some embodiments, the etch is also performed partially into sacrificial substrate 902. Upon completion of the etch, the hard mask layer is removed. The removal of the hard mask layer may, for example, be performed by an etching process or some other suitable removal process.

Figure 12:
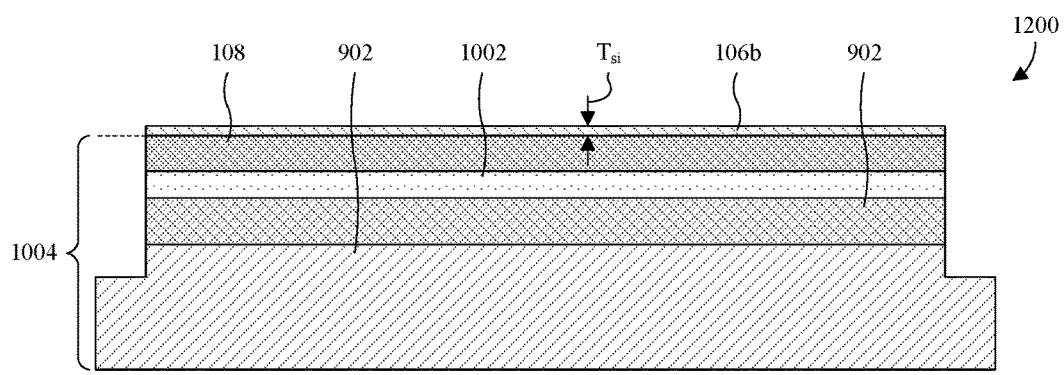

As illustrated by the cross-sectional view 1200 of FIG. 12, a second insulating layer 106b is formed on the device layer 108. In some embodiments, the second insulating layer 106b is or comprises silicon oxide, the same semiconductor material as the first insulating layer 106a of FIG. 8, some other dielectric, or any combination of the foregoing. In some embodiments, a thickness $T_{si}$ of the second insulating layer 106b is about 15-30 angstroms, about 15-20 angstroms, about 20-30 angstroms, or about 23 angstroms.

In some embodiments, a process for forming the second insulating layer 106b comprises depositing or growing the second insulating layer 106b by thermal oxidation, CVD, PVD, ALD, some other suitable oxidation or deposition process, or any combination of the foregoing. In some embodiments, the second insulating layer 106b is formed by slot plane antenna (SPA) oxidation to limit formation of the second insulating layer 106b on a top surface of the device layer 108. In some embodiments, the process for forming the second insulating layer 106b is performed at low temperature. The low temperature may, for example, be between about 350-400 degrees Celsius, about 350-375 degrees Celsius, or about 375-400 degrees Celsius, and/or may, for example, be less than about 350, 375, or 400 degrees Celsius.

Figure 13:
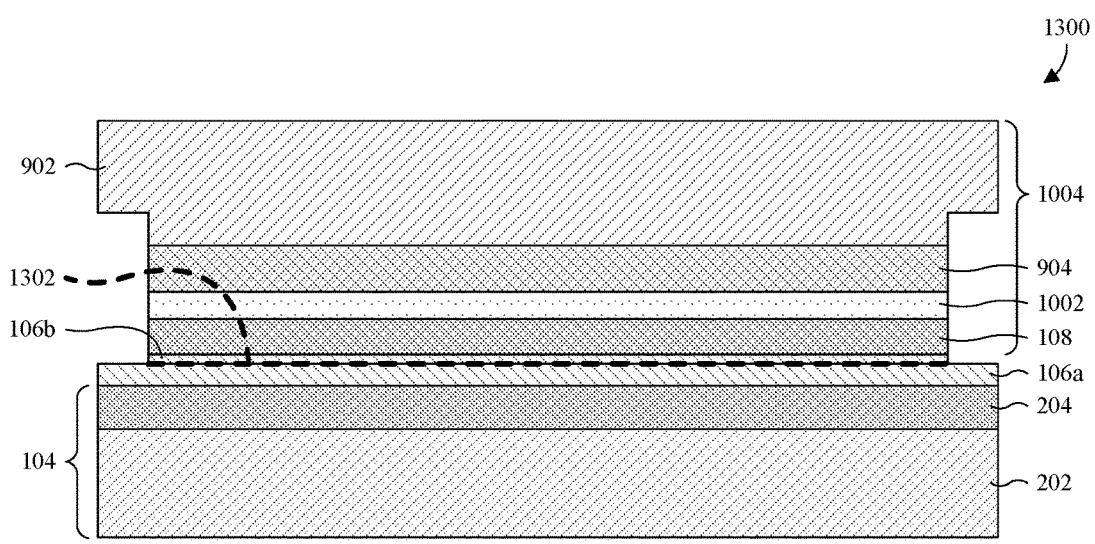

As illustrated by the cross-sectional view 1300 of FIG. 13, the device substrate 1004 is flipped vertically and bonded to the structure of FIG. 8 at a bond interface 1302 between the two structures. In some embodiments, the first and second insulating layers 106a, 106b directly contact at the bond interface 1302. In some embodiments, a process for performing the bonding comprises direct or fusion bonding. In some embodiments, the process further comprises a bond anneal. The bond anneal may, for example, be performed at temperatures between about 200-500 degrees Celsius, about 300-400 degrees Celsius, about 200-350 degrees Celsius, or about 350-500 degrees Celsius. Further, the bond anneal may, for example, be performed for about 0.5-4 hours, 1-3 hours, about 0.5-2 hours, or about 2-4 hours.

Figure 14:
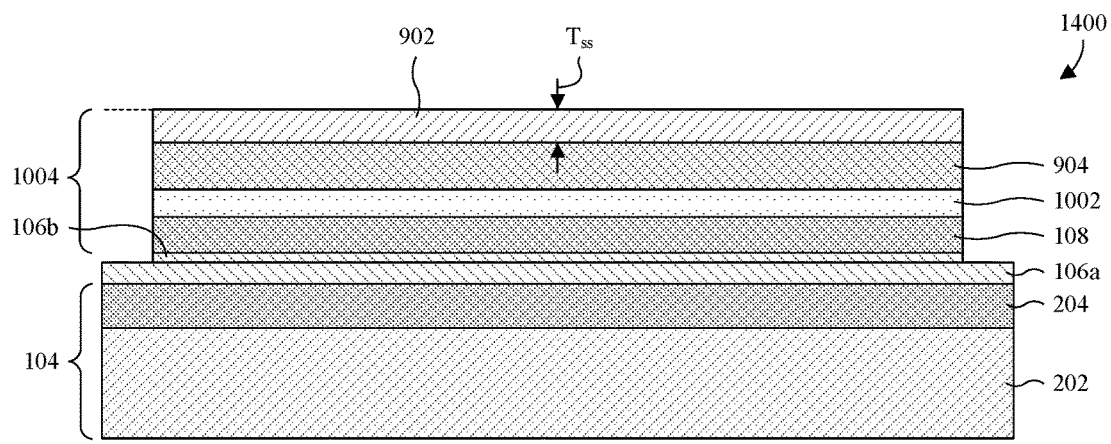

As illustrated by the cross-sectional view 1400 of FIG. 14, a second thinning process is performed to the sacrificial substrate 902 to reduce a thickness $T_{ss}$ of the sacrificial substrate 902. In some embodiments, the second thinning process is performed by a mechanical grinding process, a CMP, some other suitable thinning process, or any combination of the foregoing.

Figure 15:
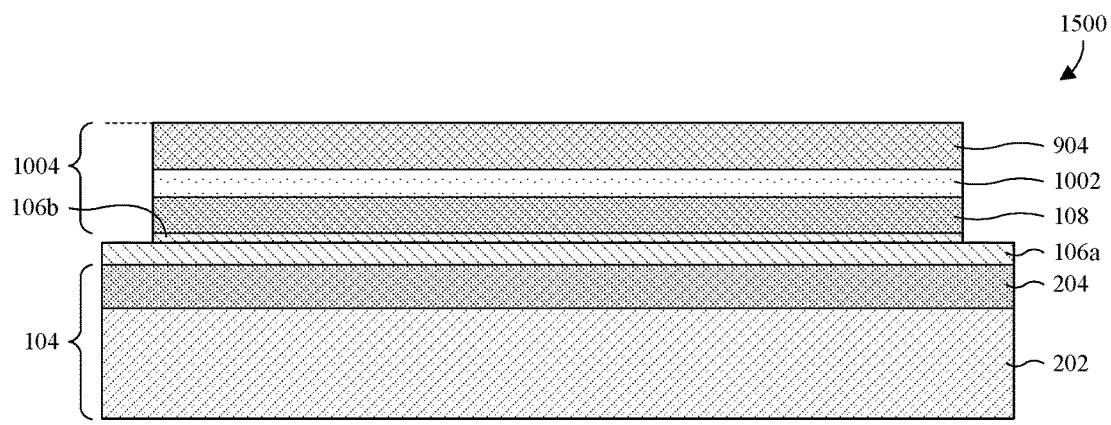

As illustrated by the cross-sectional view 1500 of FIG. 15, a first etch is performed into the sacrificial substrate 902 (see FIG. 14) to remove a remainder of the sacrificial substrate 902. The first etch stops on the buffer layer 904 and may, for example, be performed by a hydrofluoric/nitric/acetic (HNA) etch, some other wet etch, a dry etch, or some other etch. The HNA etch may, for example, etch the sacrificial substrate 902 with a chemical solution comprising hydrofluoric acid, nitric acid, and acetic acid. The first etch has a first etch rate for material of the sacrificial substrate 902, and further has a second etch rate for material of the buffer layer 904 that is less than the first etch rate. In some embodiments, the first etch rate is about 90-100, 90-95, or 95-100 times greater than the second etch rate. These embodiments may, for example, arise when the second etch is performed by the HNA etch, the sacrificial substrate 902 is or comprises P+ silicon, and the buffer layer 904 is or comprises P− silicon.

Figure 16:
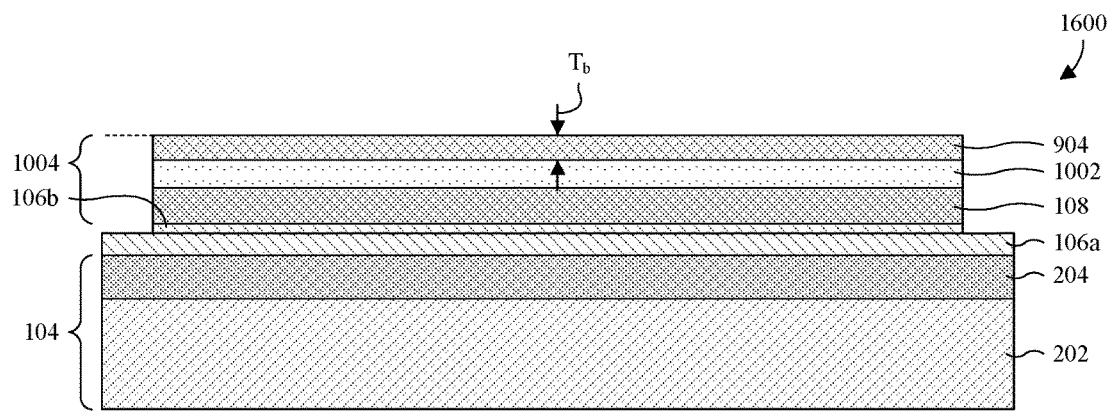

As illustrated by the cross-sectional view 1600 of FIG. 16, a third thinning process is performed into the buffer layer 904 to reduce a thickness $T_b$ of the buffer layer 904. In some embodiments, the third thinning process is performed by a CMP, some other suitable thinning process, or any combination of the foregoing.

Figure 17:
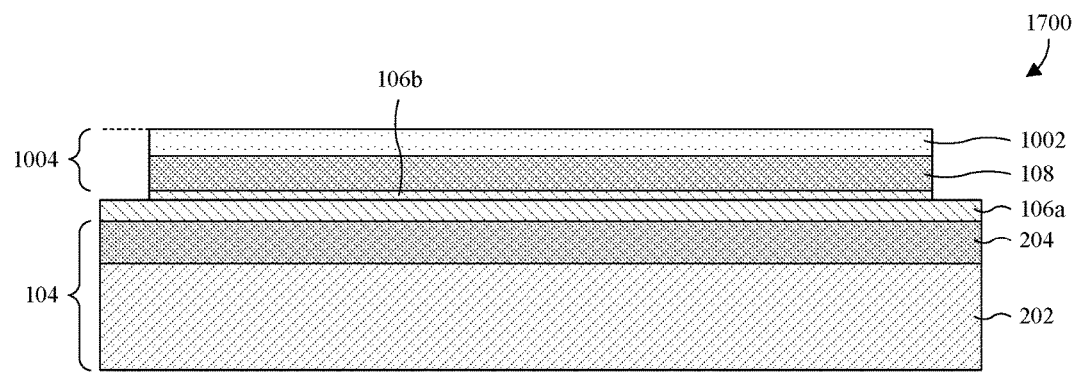

As illustrated by the cross-sectional view 1700 of FIG. 17, a second etch is performed into the buffer layer 904 (see FIG. 16) to remove a remainder of the buffer layer 904. The second etch stops on the etch stop layer 1002 and may, for example, be performed by a tetramethylammonium hydroxide (TMAH) etch, some other suitable wet etch, a dry etch, or some other suitable etch. The TMAH etch may, for example, etch the buffer layer 904 with a chemical solution comprising tetramethylammonium hydroxide. The second etch has a first etch rate for material of the buffer layer 904, and further has a second etch rate for material of the etch stop layer 1002 that is less than the first etch rate. In some embodiments, the first etch rate is about 5-15, 7-12, 5-10, or 10-15 times greater than the second etch rate. Such embodiments may, for example, arise when the second etch is performed by the TMAH etch, the buffer layer 904 is or comprises P− silicon, and the etch stop layer 1002 is or comprises silicon germanium with a germanium concentration between about 20-60, 20-40, or 40-60 atomic percent.

Figure 18:
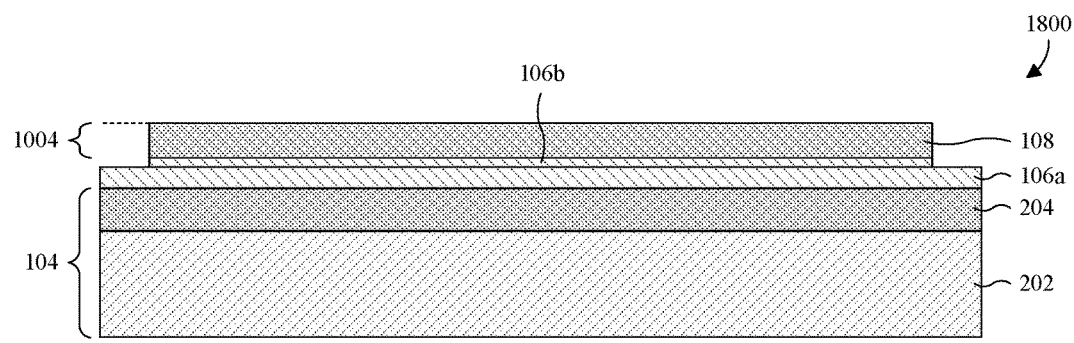

As illustrated by the cross-sectional view 1800 of FIG. 18, a third etch is performed into the etch stop layer 1002 (see FIG. 17) to remove the etch stop layer 1002. The third etch stops on the device layer 108 and may, for example, be performed by a wet etch, a dry etch, or some other suitable etch. The third etch has a first etch rate for material of the etch stop layer 1002, and further has a second etch rate for material of the device layer 108 that is less than the first etch rate. In some embodiments, the first etch rate is about 30-60, 30-45, 45-60, or 60-80 times greater than the second etch rate, and/or the first etch rate is more than about 30, 45, 60, or 80 times greater than the second etch rate. Such embodiments may, for example, arise when the third etch is performed by an enhanced wet etch process, the etch stop layer 1002 is or comprises silicon germanium, and the device layer 108 is or comprises monocrystalline silicon.

In some embodiments, the enhanced wet etch process etches the etch stop layer 1002 with an enhanced wet etchant comprising hydrofluoric acid, hydrogen peroxide, and acetic acid. During the enhanced wet etch process, the hydrofluoric acid, hydrogen peroxide, and acetic acid are simultaneously applied to the etch stop layer 1002. In some embodiments, the enhanced wet etchant, and hence the hydrofluoric acid, the hydrogen peroxide, and the acetic acid, are applied to the etch stop layer 1002 at a temperature between about 25-60, 25-45, or 45-60 degrees Celsius. In some embodiments, the enhanced wet etchant is a chemical solution, whereby it further comprises a solvent within which the hydrofluoric acid, the hydrogen peroxide, and the acetic acid are dissolved. The solvent may, for example, be deionized water or some other solvent. In some embodiments, the hydrofluoric acid has an assay weight percent (e.g., wt %) in the chemical solution that is about 8-10, about 9, or about 8.5-9.5. In some embodiments, the hydrogen peroxide has an assay weight percent (e.g., wt %) in the chemical solution that is about 5.25-15.75, about 5.25-10, or about 10-15.75. In some embodiments, the acetic acid has an assay weight percent (e.g., wt %) in the chemical solution that is about 38.4-56.7, about 38.4-47.5, or about 47.5-56.7.

In some embodiments, the enhanced wet etchant comprises a first chemical solution, a second chemical solution, and a third chemical solution. The first chemical solution may, for example, be about 30-50%, 30-40%, 40-50%, or 49% hydrofluoric acid by volume, and a remainder of the first chemical solution may, for example, be or comprise deionized water or some other solvent. The second chemical solution may, for example, be about 20-50%, 20-35%, or 35-50% hydrogen peroxide by volume, and a remainder of the second chemical solution may, for example, be or comprise deionized water or some other solvent. The third chemical solution may, for example, be about 90-100%, 90-95%, 95%-100%, or 99.8% acetic acid by volume, and a remainder of the third chemical solution may, for example, be or comprise deionized water or some other solvent. In some embodiments, the first chemical solution, the second chemical solution, the third chemical solution, any combination of the foregoing, or all of the foregoing is/are each an aqueous solution. In some embodiments, the first chemical solution, the second chemical solution, and the third chemical solution are applied to the etch stop layer 1002 simultaneously. In some embodiments, the ratio of the first chemical solution to the second chemical solution in the enhanced wet etchant is about 1:1-3, 1:1-2, or 1:2-3 by volume. In some embodiments, the ratio of the first chemical solution to the third chemical solution in the enhanced wet etchant is about 1:1-5, 1:1-2.5, or 1:2.5-5 by volume.

Because of the enhanced wet etch process and the enhanced wet etchant, the etch stop layer 1002 may be removed with high selectivity. As such, the device layer 108 may be minimally damaged by third etch process and may have a low TTV. The low TTV may, for example, be less than about 20, 10, or 5 nanometers, and/or between about 5-20 nanometers, about 5-12 nanometers, about 12-20 nanometers, or about 8-12 nanometers. The low TTV promotes uniformity in parameters of semiconductor devices formed hereafter on the device layer 108. Such parameters may, for example, include threshold voltage, on-current, and so on. As semiconductor devices continue to shrink, the low TTV becomes increasingly important.

Figure 19:
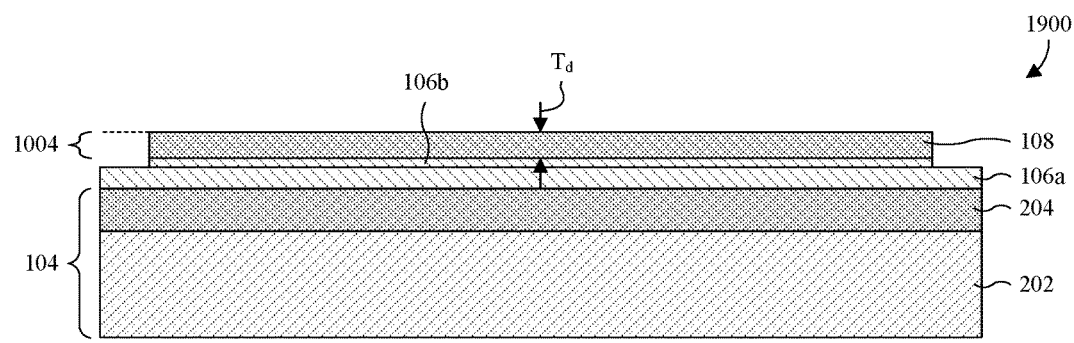

As illustrated by the cross-sectional view 1900 of FIG. 19, a fourth thinning process is performed to the device layer 108 to reduce the thickness $T_d$. In alternative embodiments of the method, the fourth thinning process is omitted. In some embodiments, the thickness $T_d$ of the device layer 108 is reduced to less than about 10, 50, 110, 120, or 150 nanometers, and/or between about 110-150 nanometers, about 10-60 nanometers, about 60-100 nanometers, or about 100-150 nanometers. In some embodiments, the fourth thinning process is performed by a CMP or some other thinning process.

Figure 20:
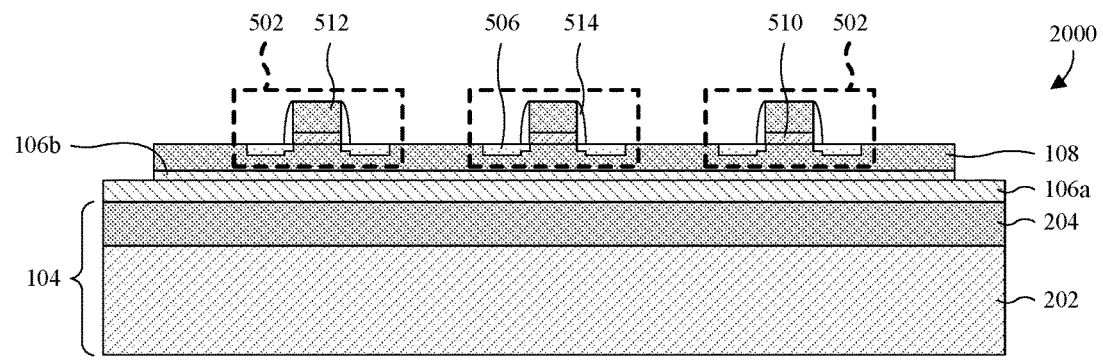

As illustrated by the cross-sectional view 2000 of FIG. 20, a plurality of semiconductor devices 502 are formed on the device layer 108. For ease of illustration, only some of the semiconductor devices 502 are labeled 502. The semiconductor devices 502 may, for example, be as described with regard to FIG. 5 and/or may, for example, be MOSFETs, some other MOS devices, some other IGFETs, some other suitable semiconductor devices, or any combination of the foregoing.

In some embodiments, a process for forming the semiconductor devices 502 comprises depositing a gate dielectric layer and a conductive layer over the device layer 108, and subsequently patterning (e.g., by photolithography) the dielectric layer and the conductive layer into gate electrodes 512 and gate dielectric layers 510. For ease of illustration, only one of the gate electrodes 512 is labeled 512, and only one of the gate dielectric layers 510 is labeled 510. A spacer dielectric layer is formed covering the semiconductor devices 502, and further lining sidewalls of the gate electrodes 512. An etch back is performed into the spacer dielectric layer to remove lateral segments of the spacer dielectric layer while leaving vertical segments of the spacer dielectric layer that define spacers 514. For ease of illustration, only one of the spacers 514 is labeled 514. The device layer 108 is doped (e.g., by ion implantation) to form source/drain regions 506 bordering sidewalls of the gate electrodes 512. For ease of illustration, only one of the source/drain regions 506 is labeled 506.

Figure 21:
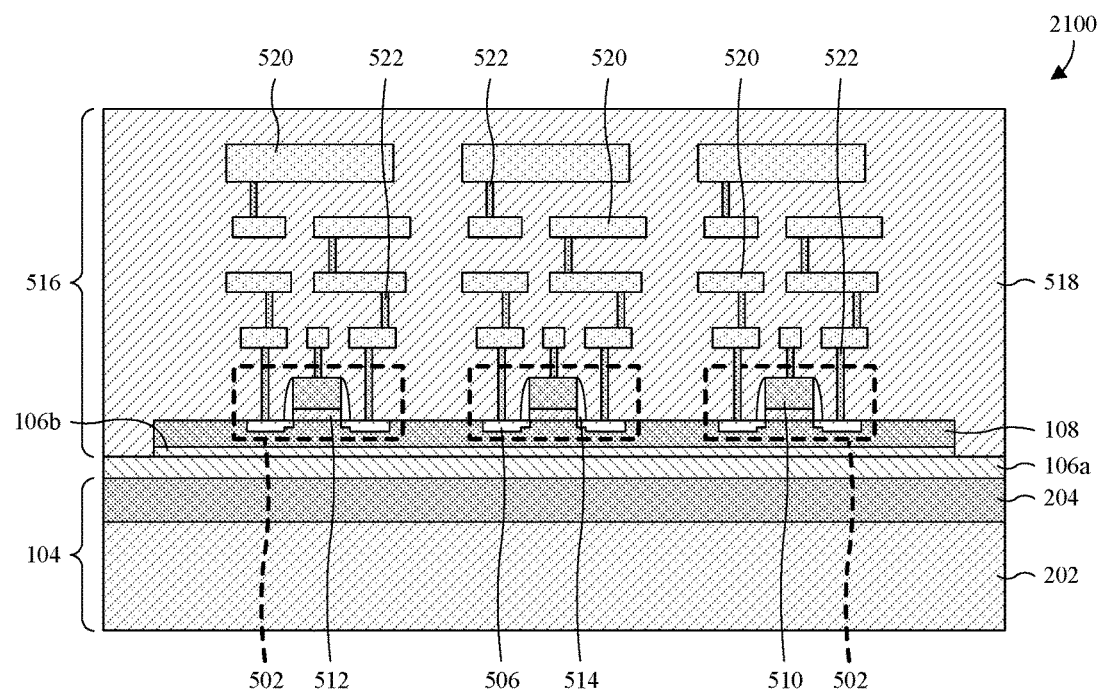

As illustrated by the cross-sectional view 2100 of FIG. 21, a BEOL interconnect structure 516 is formed over the semiconductor devices 502. The BEOL interconnect structure 516 comprises an interconnect dielectric layers 518, a plurality of wires 520, and a plurality of vias 522. For ease of illustration, only some of the wires 520 are labeled 520, and only some of the vias 522 are labeled 522. The wires 520 and the vias 522 are alternatingly stacked over the semiconductor devices 502 and define conductive paths electrically coupled to the semiconductor devices 502. In some embodiments, topmost wires of the wires 520 are thicker than underlying wires of the wires 520.

In some embodiments, a process for forming the BEOL interconnect structure 516 comprises forming a bottommost layer of the vias 522 by a single damascene process. Further, in some embodiments, the process comprises forming overlying layers of the vias 522 and overlying layers of the wires 520 by repeatedly performing a dual damascene process.

Figure 22:
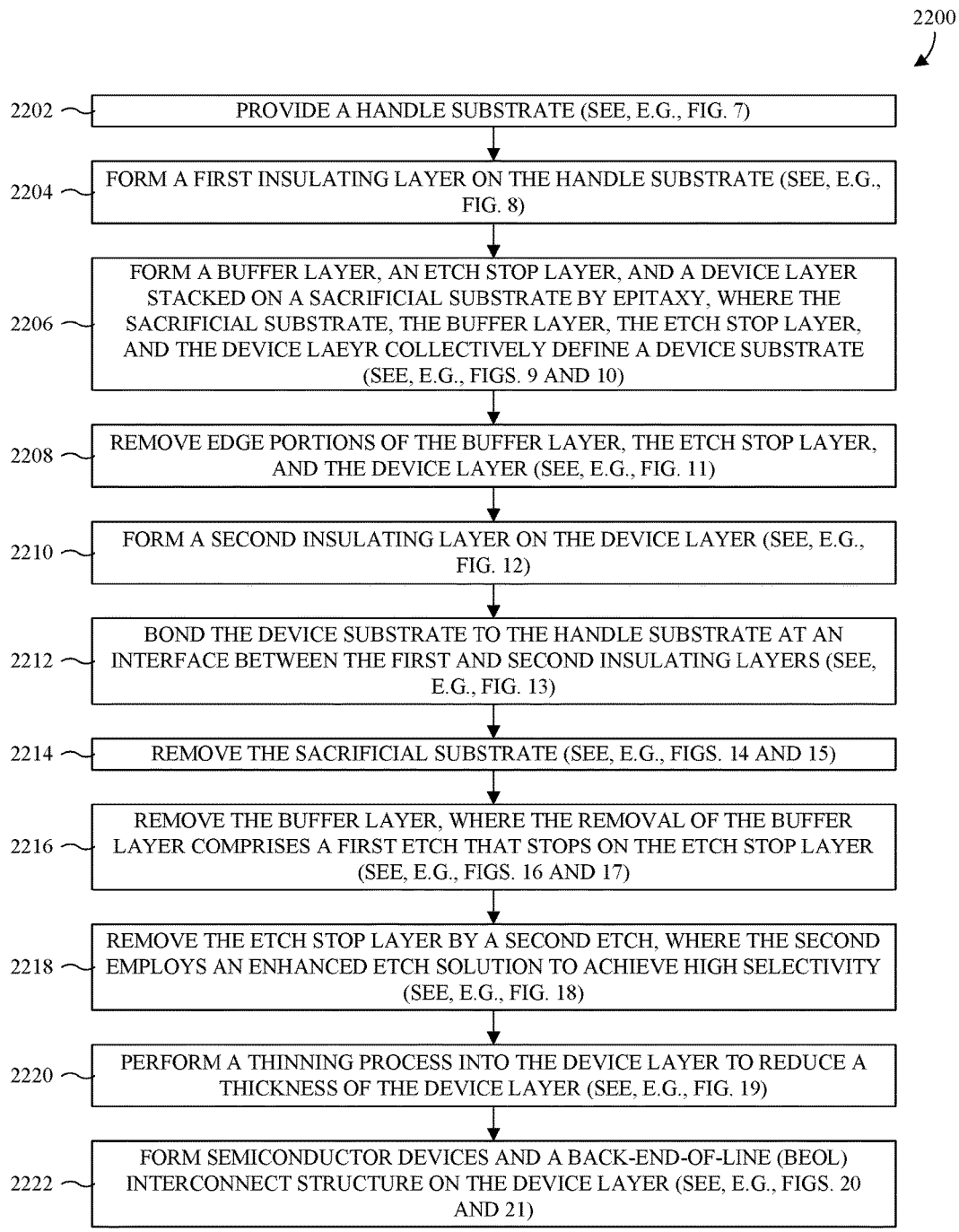
FIG. 22 illustrates a block diagram of some embodiments of the method of FIGS. 7-21.

With reference to FIG. 22, a block diagram 2200 of some embodiments of the method of FIGS. 7-20 is provided. The method may, for example, form a SOI substrate with a small thickness and/or a low TTV. Further, because the method does not rely upon a hydrogen implant and splitting, the method may form the SOI substrate at low cost.

At 2202, a handle substrate is provided. See, for example, FIG. 7.

At 2204, a first insulating layer is formed on the handle substrate. See, for example, FIG. 8.

At 2206, a buffer layer, an etch stop layer, and a device layer are formed stacked on a sacrificial substrate by epitaxy, where the sacrificial substrate, the buffer layer, the etch stop layer, and the device layer collectively define a device substrate. See, for example, FIGS. 9 and 10. By forming the device layer by epitaxy, a thickness of the device layer may be controlled to a high degree and, in at least some embodiments, the device layer may have a thickness less than a small thickness less than about 120 or 150 nanometers. Further, by forming the device layer by epitaxy, the device layer has high crystalline quality and a low concentration of dislocations and other crystalline defects. As a result, semiconductor devices formed on the device layer may have low leakage current, high power efficiency, and high speed.

At 2208, edge portions of the buffer layer, the etch stop layer, and the device layer are removed. See, for example, FIG. 11.

At 2210, a second insulating layer is formed on the device layer. See, for example, FIG. 12.

At 2212, the device substrate is bonded to the handle substrate at an interface between the first and second insulating layers. See, for example, FIG. 13.

At 2214, the sacrificial substrate is removed. See, for example, FIGS. 14 and 15.

At 2216, the buffer layer is removed, where the removal of the buffer layer comprises a first etch that stops on the etch stop layer. See, for example, FIGS. 16 and 17. Where the buffer layer is or comprises P– monocrystalline silicon, and the buffer layer is or comprises silicon germanium, the first etch may, for example, be performed by a TMAH etch.

At 2218, the etch stop layer is removed by a second etch, where the second etch employs an enhanced etch solution (or recipe) to achieve a high selectivity. See, for example, FIG. 18. Where the etch stop layer is or comprises silicon germanium, and the device layer is or comprises monocrystalline silicon, the enhanced etch solution may, for example, comprise hydrofluoric acid, hydrogen peroxide, and acetic acid. The enhanced etch solution has a high selectivity for the etch stop layer, such that the device layer is minimally damaged by the second etch and such that the device layer has a low TTV.

At 2220, perform a thinning process into the device layer to reduce a thickness of the device layer. See, for example, FIG. 19.

At 2222, semiconductor devices and a BEOL interconnect structure are formed on the device layer. See, for example, FIGS. 20 and 21. Because the device layer has a low TTV, uniformity between the semiconductor devices is high.

While the block diagram 2200 of FIG. 22 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 23A:
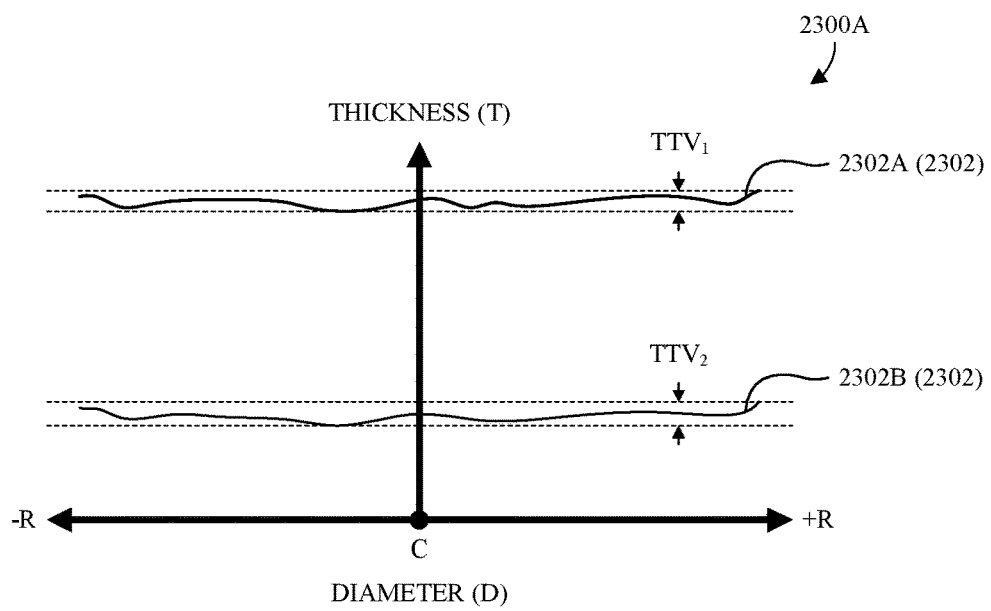
FIGS. 23A and 23B illustrate various thickness curves for some embodiments of a device substrate at various points during the method of FIGS. 7-21.
Figure 23B:
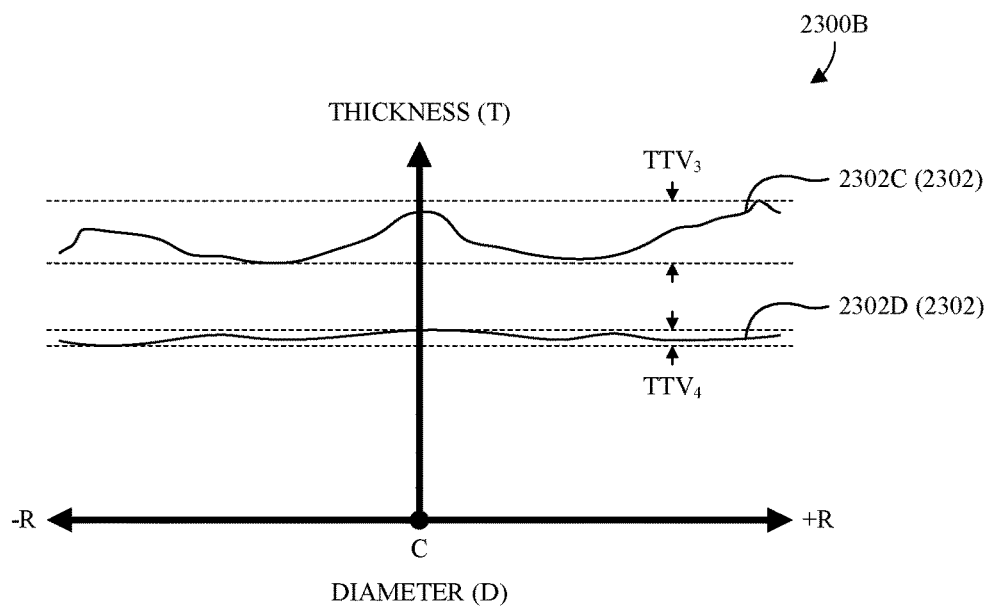

With reference to FIGS. 23A and 23B, graphs 2300A, 2300B illustrate various thickness curves 2302 for some embodiments of the device substrate 1004 at various stages of manufacture during the method of FIGS. 7-21.

The thickness curves 2302 are spread across FIGS. 23A and 23B due to different scales. For example, thickness T at FIG. 23A may span about 0-3.5 micrometers, whereas thickness T at FIG. 23B may span about 0 to 200 nanometers. Further, the thickness curves 2302 each describe thickness of the device substrate 1004 as a function of location along a diameter of device substrate 1004, such that it should be appreciated that the device substrate 1004 has a circular top layout and/or is a circular wafer in the embodiments of FIGS. 23A and 23B. The diameter of the device substrate 1004 has a length of two times the radius R of the device substrate 1004 and extends from –R to +R relative to the center C of the device substrate 1004. The diameter may, for example, be about 12 inches.

With specific reference to FIG. 23A, the first etch at FIG. 15 results in a first thickness curve 2302A. A first TTV ($TTV_1$) of the first thickness curve 2302A may, for example, be about 150-170 nanometers, about 150-160 nanometers, about 160-170 nanometers, or about 158 nanometers. In some embodiments, the buffer layer 904 also has the first TTV upon completion of the first etch at FIG. 15. Additionally, the thinning process at FIG. 16 results in a second thickness curve 2302B. A second TTV ($TTV_2$) of the second thickness curve 2302B is greater than the first TTV and may, for example, be about 175-195 nanometers, about 175-185 nanometers, about 185-195 nanometers, or about 184 nanometers. In some embodiments, the buffer layer 904 also has the second TTV upon completion of the thinning process at FIG. 16.

With specific reference to FIG. 23B, the second etch at FIG. 17 results in a third thickness curve 2302C. A third TTV ($TTV_3$) of the third thickness curve 2302C is less than the second TTV and may, for example, be about 25-45 nanometers, about 25-35 nanometers, about 35-45 nanometers, or about 33.9 nanometers. In some embodiments, the etch stop layer 1002 also has the third TTV upon completion of the second etch at FIG. 17. Additionally, the third etch at FIG. 18 results in a fourth thickness curve 2302D. A fourth TTV ($TTV_4$) of the fourth thickness curve 2302D is less than the third TTV and may, for example, be about 5-20 nanometers, about 5-10 nanometers, about 10-20 nanometers, about 9 nanometers, or less than about 10 nanometers. In some embodiments, the device layer 108 also has the fourth TTV upon completion of the third etch at FIG. 18.

In some embodiments, the present application provides a method for forming a SOI substrate, the method including: epitaxially forming an etch stop layer on a sacrificial substrate; epitaxially forming a device layer on the etch stop layer, wherein the device layer has a different crystalline lattice than the etch stop layer; bonding the sacrificial substrate to a handle substrate, such that the device layer and the etch stop layer are between the sacrificial and handle substrates; removing the sacrificial substrate; and performing an etch into the etch stop layer to remove the etch stop layer, wherein the etch is performed using an etchant including hydrofluoric acid, hydrogen peroxide, and acetic acid. In some embodiments, the etchant further includes a solvent within which the hydrofluoric acid, the hydrogen peroxide, and the acetic acid are dissolved, and wherein weight percentages for the hydrofluoric acid, the hydrogen peroxide, and the acetic acid are respectively about 8.5-9.5, about 5.25-15.75, and about 38.4-56.7. In some embodiments, the device layer has a TTV less than about 10 nanometers, and further has a thickness less than about 120 nanometers, upon completion of the etch. In some embodiments, the etch stop layer includes silicon germanium layer, and wherein the device layer includes monocrystalline silicon. In some embodiments, the etchant includes a first chemical solution, a second chemical solution, and a third chemical solution, wherein the first chemical solution is less than about 50% hydrofluoric acid by volume, wherein the second chemical solution is less than about 51% hydrogen peroxide by volume, and wherein the third chemical solution is greater than about 90% acetic acid by volume. In some embodiments, a ratio of the first chemical solution to the second chemical solution is about 1:1-3 by volume, and wherein a ratio of the first chemical solution to the third chemical solution is about 1:1-5 by volume. In some embodiments, the etchant has a first etch rate for the etch stop layer, and further has a second etch rate for the device layer, and wherein the first etch rate is about 30-60 times greater than the first etch rate.

In some embodiments, the present application provides another method for forming a SOI substrate, the method including: epitaxially forming a buffer layer on a sacrificial substrate; epitaxially forming an etch stop layer on the buffer layer; epitaxially forming a device layer on the etch stop layer, wherein the device layer has a different crystalline lattice than the etch stop layer; bonding the sacrificial substrate to a handle substrate, such that the device layer, the etch stop layer, and the buffer layer are between the sacrificial and handle substrates; removing the sacrificial substrate; performing a first etch into the buffer layer to remove the buffer layer, wherein the first etch has a first etch rate for the buffer layer, and further has a second etch rate for the etch stop layer; and performing a second etch into the etch stop layer to remove the etch stop layer, wherein the second etch has a third etch rate for the etch stop layer, and further has a fourth etch rate for the device layer, and wherein a ratio of the first etch rate to the second etch rate is less than a ratio of the third etch rate to the fourth etch rate. In some embodiments, the first etch rate is about 7-12 times greater than the second etch rate, and wherein the third etch rate is about 30-60 times greater than the fourth etch rate. In some embodiments, the device layer is grown by epitaxy using the etch stop layer as a seed layer, and wherein the device layer is under tensile stress from the etch stop layer. In some embodiments, the device layer directly contacts the etch stop layer and includes silicon germanium, and wherein the etch stop layer includes monocrystalline silicon. In some embodiments, the etch stop layer includes about 20-60% germanium by mass. In some embodiments, the second etch is performed using an etchant including a first aqueous solution, a second aqueous solution, and a third aqueous solution, wherein the first aqueous solution is about 40-60% hydrofluoric acid by volume, wherein the second aqueous solution is about 20-50% hydrogen peroxide by volume, wherein the third aqueous solution is greater than about 90% acetic acid by volume, wherein a ratio of the first aqueous solution to the second aqueous solution is about 1:1-3 by volume, wherein a ratio of the first aqueous solution to the third aqueous solution is about 1:1-5 by volume, and wherein the second etch is performed at a temperature of about 25-60 degrees Celsius. In some embodiments, a TTV of the etch stop layer upon completion of the first etch is greater than a TTV of the device layer upon completion of the second etch.

In some embodiments, the present application provides a method including: epitaxially forming a buffer layer on a sacrificial substrate; epitaxially forming an etch stop layer on a sacrificial substrate, wherein the etch stop layer includes a different semiconductor material than the buffer layer; epitaxially forming a device layer on the etch stop layer, wherein the device layer includes the same semiconductor material as the buffer layer; bonding the sacrificial substrate to a handle substrate, such that the buffer layer, the etch stop layer, and the device layer are between the sacrificial and handle substrates; performing a first etch into the sacrificial substrate to remove the sacrificial substrate and to expose the buffer layer, wherein the buffer layer has a first TTV upon completion of the first etch; performing a thinning process into the buffer layer to partially remove the buffer layer, wherein the buffer layer has a second TTV upon completion of the thinning process; performing a second etch into the buffer layer to remove a remainder of the buffer layer and to expose the etch stop layer, wherein the etch stop layer has a third TTV upon completion of the second etch; and performing a third etch into the etch stop layer to remove the etch stop layer and to expose the device layer, wherein the device layer has a fourth TTV upon completion of the third etch, wherein first TTV is less than the second TTV and is greater than the third TTV, and wherein the fourth TTV is less than the third TTV. In some embodiments, the first etch employs a HNA etchant, wherein the second etch employs a TMAH etchant, and wherein the third etch employs an etchant including hydrofluoric acid, hydrogen peroxide, and acetic acid. In some embodiments, the method further includes removing a ring-shaped edge portion of the device layer, a ring-shaped edge portion of the etch stop layer, and a ring-shaped edge portion of the buffer layer before the bonding. In some embodiments, the fourth TTV is less than about 10 nanometers. In some embodiments, the method further includes forming an insulating on the handle substrate, wherein the bonding is such that the insulating layer is between the handle substrate and the device layer upon completion of the bonding. In some embodiments, the method further includes forming a semiconductor device on the device layer, wherein the semiconductor device is at least partially defined by the device layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor-on-insulator (SOI) substrate, the method comprising:
   epitaxially forming an etch stop layer on a sacrificial substrate;
   epitaxially forming a device layer on the etch stop layer, wherein the device layer has a different crystalline lattice than the etch stop layer;
   bonding the sacrificial substrate to a handle substrate, such that the device layer and the etch stop layer are between the sacrificial and handle substrates;
   removing the sacrificial substrate; and
   performing an etch into the etch stop layer to remove the etch stop layer, wherein the etch is performed using an etchant comprising hydrofluoric acid, hydrogen peroxide, and acetic acid, wherein the etchant further comprises a solvent within which the hydrofluoric acid, the hydrogen peroxide, and the acetic acid are dissolved, and wherein the hydrofluoric acid, the hydrogen peroxide, and the acetic acid have individual weight percentages in the etchant that are respectively about 8-10, about 5.25-15.75, and about 38.4-56.7.

2. The method according to claim 1, wherein the hydrofluoric acid has a weight percentage in the etchant that is about 8.5-9.5.

3. The method according to claim 1, wherein the device layer has a total thickness variation (TTV) less than about 10 nanometers, and further has a thickness less than about 120 nanometers, upon completion of the etch.

4. The method according to claim 1, wherein the etch stop layer comprises silicon germanium, and wherein the device layer comprises monocrystalline silicon.

5. The method according to claim 1, wherein the etchant comprises a first chemical solution, a second chemical solution, and a third chemical solution, wherein the first chemical solution is less than about 50% hydrofluoric acid by volume, wherein the second chemical solution is less than about 51% hydrogen peroxide by volume, and wherein the third chemical solution is greater than about 90% acetic acid by volume.

6. The method according to claim 5, wherein a ratio of the first chemical solution to the second chemical solution is about 1:1-3 by volume, and wherein a ratio of the first chemical solution to the third chemical solution is about 1:1-5 by volume.

7. The method according to claim 1, wherein the etchant has a first etch rate for the etch stop layer, and further has a second etch rate for the device layer, and wherein the first etch rate is about 30-60 times greater than the first etch rate.

8. A method for forming a semiconductor-on-insulator (SOI) substrate, the method comprising:
   epitaxially forming a buffer layer on a sacrificial substrate;
   epitaxially forming an etch stop layer on the buffer layer;
   epitaxially forming a device layer on the etch stop layer, wherein the device layer has a different crystalline lattice than the etch stop layer;
   bonding the sacrificial substrate to a handle substrate, such that the device layer, the etch stop layer, and the buffer layer are between the sacrificial and handle substrates;
   removing the sacrificial substrate;
   performing a first etch into the buffer layer to remove the buffer layer, wherein the first etch has a first etch rate for the buffer layer, and further has a second etch rate for the etch stop layer; and
   performing a second etch into the etch stop layer to remove the etch stop layer, wherein the second etch has a third etch rate for the etch stop layer, and further has a fourth etch rate for the device layer, and wherein a ratio of the first etch rate to the second etch rate is less than a ratio of the third etch rate to the fourth etch rate.

9. The method according to claim 8, wherein the first etch rate is about 7-12 times greater than the second etch rate, and wherein the third etch rate is about 30-60 times greater than the fourth etch rate.

10. The method according to claim 8, wherein the device layer is grown by epitaxy using the etch stop layer as a seed layer, and wherein the device layer is under tensile stress from the etch stop layer.

11. The method according to claim 8, wherein the device layer directly contacts the etch stop layer and comprises silicon germanium, and wherein the etch stop layer comprises monocrystalline silicon.

12. The method according to claim 11, wherein the etch stop layer comprises about 20-60% germanium by mass.

13. The method according to claim 8, wherein the second etch is performed using an etchant comprising a first aqueous solution, a second aqueous solution, and a third aqueous solution, wherein the first aqueous solution is about 40-60% hydrofluoric acid by volume, wherein the second aqueous solution is about 20-50% hydrogen peroxide by volume, wherein the third aqueous solution is greater than about 90% acetic acid by volume, wherein a ratio of the first aqueous solution to the second aqueous solution is about 1:1-3 by volume, wherein a ratio of the first aqueous solution to the third aqueous solution is about 1:1-5 by volume, and wherein the second etch is performed at a temperature of about 25-60 degrees Celsius.

14. The method according to claim 8, wherein a total thickness variation (TTV) of the etch stop layer upon completion of the first etch is greater than a TTV of the device layer upon completion of the second etch.

15. A method comprising:
   epitaxially forming a buffer layer on a sacrificial substrate;
   epitaxially forming an etch stop layer on the buffer layer, wherein the etch stop layer comprises a different semiconductor material than the buffer layer;
   epitaxially forming a device layer on the etch stop layer, wherein the device layer comprises the same semiconductor material as the buffer layer;
   bonding the sacrificial substrate to a handle substrate, such that the buffer layer, the etch stop layer, and the device layer are between the sacrificial and handle substrates;
   performing a first etch into the sacrificial substrate to remove the sacrificial substrate and to expose the buffer layer, wherein the buffer layer has a first total thickness variation (TTV) upon completion of the first etch;

performing a thinning process into the buffer layer to partially remove the buffer layer, wherein the buffer layer has a second TTV upon completion of the thinning process;

performing a second etch into the buffer layer to remove a remainder of the buffer layer and to expose the etch stop layer, wherein the etch stop layer has a third TTV upon completion of the second etch; and performing a third etch into the etch stop layer to remove the etch stop layer and to expose the device layer, wherein the device layer has a fourth TTV upon completion of the third etch, wherein first TTV is less than the second TTV and is greater than the third TTV, and wherein the fourth TTV is less than the third TTV.

16. The method according to claim 15, wherein the first etch employs a hydrofluoric/nitric/acetic (HNA) etchant, wherein the second etch employs a tetramethylammonium hydroxide (TMAH) etchant, and wherein the third etch employs an etchant comprising hydrofluoric acid, hydrogen peroxide, and acetic acid.

17. The method according to claim 15, further comprising:

removing a ring-shaped edge portion of the device layer, a ring-shaped edge portion of the etch stop layer, and a ring-shaped edge portion of the buffer layer before the bonding.

18. The method according to claim 15, wherein the fourth TTV is less than about 10 nanometers.

19. The method according to claim 15, further comprising:

forming an insulating layer on the handle substrate, wherein the bonding is such that the insulating layer is between the handle substrate and the device layer upon completion of the bonding.

20. The method according to claim 15, further comprising:

forming a semiconductor device on the device layer, wherein the semiconductor device is at least partially defined by the device layer.

* * * * *